(12) United States Patent
Budde et al.

(10) Patent No.: US 11,128,111 B2
(45) Date of Patent: Sep. 21, 2021

(54) CONTROL SYSTEM AND METHOD OF MOUNTING A CONTROL SYSTEM

(71) Applicant: Beckhoff Automation GmbH, Verl (DE)

(72) Inventors: Torsten Budde, Gütersloh (DE); Lars Sommer, Oerlinghausen (DE); Michael Jost, Dörentrup (DE); Hans Beckhoff, Verl (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 16/875,393

(22) Filed: May 15, 2020

(65) Prior Publication Data
US 2020/0280177 A1 Sep. 3, 2020

Related U.S. Application Data

(63) Continuation of application No. PCT/EP2019/082597, filed on Nov. 26, 2019.

(30) Foreign Application Priority Data

Nov. 26, 2018 (DE) .......................... 102018129835.8

(51) Int. Cl.
*H05K 7/14* (2006.01)
*H02B 1/052* (2006.01)
(Continued)

(52) U.S. Cl.
CPC .......... *H02B 1/052* (2013.01); *H01H 71/082* (2013.01); *H01R 9/2608* (2013.01);
(Continued)

(58) Field of Classification Search
CPC .......... H02B 1/052; H02B 1/056; H02B 1/21; H02B 1/26; H05K 1/162; H05K 7/1465;
(Continued)

(56) References Cited

U.S. PATENT DOCUMENTS 3,566,190 A   2/1971   Huebner et al.
4,956,747 A   9/1990   Beer et al.
(Continued)

FOREIGN PATENT DOCUMENTS

CN   1933255 A   3/2007
CN   1953652 A   4/2007
(Continued)

OTHER PUBLICATIONS

Beckhoff Automation GmbH, "EJ1100 | EtherCAT Coupler," at www.beckhoff.de/default.asp?ethercat/ej1100.htm?id=4517226 (Jan. 1, 2019), 1 page.
(Continued)

*Primary Examiner* — Robert J Hoffberg
(74) *Attorney, Agent, or Firm* — Dorsey & Whitney LLP

(57) ABSTRACT

A control system and a method for mounting a control system, the control system comprising a signal-distribution board, a top-hat rail, at least a first contact device and at least a second contact device. The first contact device and the second contact device are arranged at the signal-distribution board with an offset relative to each other with the signal-distribution board electrically connecting the first contact device to the second contact device for at least transmitting data. The top-hat rail is mechanically fastened to the signal-distribution board and a first coupling module may be mechanically fastened to the top-hat rail, where the second contact device is embodied to electrically contact a signal-processing module or a second coupling module. The first contact device may be electrically connected to a field device.

19 Claims, 17 Drawing Sheets

(51) Int. Cl.
*H01H 71/08* (2006.01)
*H01R 9/26* (2006.01)
*H02B 1/056* (2006.01)
*H04B 3/54* (2006.01)
*H05K 1/16* (2006.01)

(52) U.S. Cl.
CPC ........... *H01R 9/2675* (2013.01); *H02B 1/056* (2013.01); *H04B 3/548* (2013.01); *H05K 1/162* (2013.01); *H05K 7/1465* (2013.01); *H05K 7/1477* (2013.01)

(58) Field of Classification Search
CPC ............... H05K 7/1477; H01H 71/082; H01H 2300/03; H02J 13/00034; H02J 13/00036; H02J 13/00; H04B 3/548; Y04S 20/14; Y04S 20/20; Y02B 90/20; Y02B 90/30; H01R 9/2608; H01R 9/2675; G08C 19/00
See application file for complete search history.

(56) References Cited

U.S. PATENT DOCUMENTS

| | | | | |
|---|---|---|---|---|
| 5,012,390 | A | 4/1991 | Erbele | |
| 5,978,193 | A * | 11/1999 | Kaaden | H02J 13/00036 361/64 |
| 6,322,399 | B1 * | 11/2001 | Hanning | H01R 9/26 439/406 |
| 6,456,495 | B1 * | 9/2002 | Wieloch | H05K 7/1468 312/215 |
| 7,336,497 | B2 | 2/2008 | Eusterholz | H01R 9/2625 361/725 |
| 9,077,097 | B2 * | 7/2015 | Karodi | H01R 13/7034 |
| 10,027,108 | B2 * | 7/2018 | Peach | H02H 3/048 |
| 10,136,528 | B2 * | 11/2018 | Budde | H05K 7/1484 |
| 10,170,904 | B2 * | 1/2019 | Peach | H02H 9/005 |
| 2005/0077069 | A1 | 4/2005 | Quero et al. | |
| 2020/0060039 | A1 * | 2/2020 | De Carolis | H01R 33/94 |

FOREIGN PATENT DOCUMENTS

| | | | |
|---|---|---|---|
| CN | 201290200 Y | 8/2009 | |
| CN | 205071579 U | 3/2016 | |
| CN | 106028753 A | 10/2016 | |
| CN | 107294356 A | 10/2017 | |
| CN | 107371349 A | 11/2017 | |
| DE | 69610741 T2 | 5/2001 | |
| DE | 20009207 U1 | 9/2001 | |
| DE | 202014101491 U1 | 7/2015 | |
| DE | 102014111031 A1 | 2/2016 | |
| DE | 102014118389 A1 | 6/2016 | |
| EP | 1770738 A2 | 4/2007 | |
| JP | H02110387 U * | 9/1990 | |
| RU | 183310 U1 * | 9/2018 | |
| WO | WO-0013264 A1 * | 3/2000 | ........... H01R 9/2658 |

OTHER PUBLICATIONS

Beckhoff Automation GmbH, "EJxxxx | EtherCAT plug-in modules," at www.beckhoff.com/default.asp?ethercat/ejxxxx.htm?id=23562 (May 16, 2018), 1 page.

Beckhoff Automation GmbH, "EK1110 | EtherCAT extension," at www.beckhoff.de/default.asp?ethercat/ek1110.htm?id=1983920619 (Jan. 1, 2018), 1 page.

Beckhoff Automation GmbH, "Embedded PC CX," at www.beckhoff.de/default.asp?embedded_pc/cx.htm?id=15987 (Nov. 29, 2019), 1 page.

Beckhoff Automation GmbH, "EtherCAT Plug-in Modules," at http://www.beckhoff.com/EtherCAT-Plug-in-Modules/ (May 16, 2018), 7 pages.

Beckhoff Automation GmbH, "Documentation EK110x, EK15xx, EtherCAT Bus Coupler," v. 3.7, at download.beckhoff.com/download/document/io/ethercat-terminals/ek110x_ek15xxen.pdf (Nov. 28, 2018), 85 pages.

International Search Report and Written Opinion dated Feb. 26, 2020 in connection with International Patent Application No. PCT/EP2019/082597, 29 pages including English translation.

Jianhua et al. "Development of PLC electrical control learning device." Dec. 10, 2015, 9 pages including English translation.

First Office Action dated Mar. 1, 2021 in connection with Chinese patent application No. 201980010341.8, 15 pages including English translation.

* cited by examiner

CONTROL SYSTEM AND METHOD OF MOUNTING A CONTROL SYSTEM

CROSS-REFERENCE TO RELATED APPLICATIONS

This patent application claims priority to German patent application DE 10 2018 129 835.8 filed 26 Nov. 2018, entitled "Steuerungssystem, Kopplermodul und Verfahren zur Montage eines Steuerungssystems," the entire disclosure and content of which is hereby incorporated by reference.

FIELD

The present invention relates to a control system for an automation system and a method for mounting a control system.

BACKGROUND

In automation technology, industrial control systems are used for plant, machine and process control, for example to control and monitor manufacturing processes or packaging processes. An industrial control system generally has a field level comprising field devices and a control level comprising control units. The field devices used in industrial process automation include actuators, such as drives or valves, and measuring transducers, such as encoders and sensors.

The control level inter alia comprises devices for programming, controlling, monitoring and visualizing the processes to be executed. Here, programmable logic controllers or control computers, such as industrial PCs, are usually used. A control computer may, for example, be used as a process control computer in a production line.

For communication between the control level and the field level, field-bus systems are generally used which transmit communication data via a data network. The communication data may inter alia be control commands for activating field devices or measuring data. The measuring data may, for example, be based on measured values that have previously been detected by a field device. Field-bus systems use various protocols for transmitting data. One possible data-transfer protocol is the EtherCAT protocol, which enables real-time communication via an Ethernet network and is specified in the IEC 61158 standard. In a data transmission according to the EtherCAT standard, data telegrams are used for transmitting data. The data telegrams contain control data which regulate the distribution and processing of the data telegrams in the field-bus system, and user data, which inter alia comprise the communication data.

Field-bus systems may be embodied in various network topologies which describe the arrangement of the individual bus subscribers within the field-bus system. In a ring topology, all bus subscribers are connected in series one after the other. Starting from a first bus subscriber, data packets comprising the communication data in sequence pass through all other bus subscribers that are capable of exchanging communication data comprising the data packets. The data packages are then sent back to the first bus subscriber. A variant of the ring topology is the line topology, which represents an open ring. After the data packages have passed through all the bus subscribers in sequence, the data packages are sent back to the first bus subscriber via the bus subscribers in the opposite direction. The first bus subscriber is usually a device at the control level, such as a control computer.

A real-time-capable field-bus system in line topology may be implemented using the EtherCAT standard, which is specified in the IEC 61158 standard. In the EtherCAT standard, the Ethernet standard or the E-bus standard which is based on low-voltage differential signaling may be used on the bit transmission layer. LVDS is a wire- or cable-based transmission technology that uses differential voltage levels for transmitting data and is specified in the ANSI/TIA/EIA-644-1995 standard. Data transmission in E-bus systems is based on a current flow generated by a constant current source through a two-wire transmission line, wherein binary logic values are represented by the direction of the current flow. The impedance of the transmission line is usually about 100-120 Ohm. By LVDS, data rates of several 100 Mbit/s or several GBit/s may be provided. In an E-bus system, data telegrams encapsulating the EtherCAT data telegrams are used to transmit the communication data.

The various field devices used for process control, such as drives or sensors, do not usually have their own integrated interface to the field bus. They are therefore not controlled directly via the digital communication data, but transmit or receive digital or analogous field signals. The field signals may be analogous or digital voltage levels, for example. Accordingly, the individual field devices usually have one or more digital or analogous inputs and outputs. If the field devices are embodied as motors or drives, they may also be controlled via regulated currents which, under certain circumstances, may also transmit high drive power.

Control modules are usually used to convert the communication data into field signals. The control modules are connected to the devices on the control level via the field-bus system as well as to the field devices via field-signal lines. The control modules may be embodied as digital or analogous input modules or as digital or analogous output modules.

If they are output modules, the control modules receive control commands from the devices at the control level as communication data via the field-bus system. Based on the control commands, the output modules generate outgoing field signals, which may consist of analogous or digital voltage signals or regulated currents, among other things. The field signals are output via output connections of the control modules. The outgoing field signals are then transmitted to the field devices via the field signal lines. The outgoing field signals may be used to control drives, motors or valves, among other things.

If the control modules are input modules, the control module receives incoming field signals which may consist of analogous or digital voltage or current signals, among other things. The input module converts the field signals into communication data which may represent measured voltage or current values. The control module may then transmit the communication data via the field-bus system to the devices at the control level, for example to a control computer.

The control modules typically provide several connections for the field signals. In this context, a control module may have only one type of connection, such as only input connections or only output connections or, respectively, only digital or only analogous connections. If both analogous and digital field signals are required to operate a field device, or if both inputs and outputs are required to operate a field device, the corresponding signal lines are usually connected to several different control modules. The signal lines from different control modules required for a field device or for a group of field devices may be combined to form signal line harnesses. The individual signal line harnesses are then laid to the different field devices. Combining the individual signal lines to form field-device-specific signal line harnesses is also referred to as signal routing.

DE 20 2014 101 491 U1 discloses a bus-compatible and serially connectable connection and/or functional module for controlling and/or monitoring technical processes having a block-like structure.

A switching-cabinet module mounting system is known from US 2005/0077069 A.

DE 10 2014 118 389 A discloses an automation device with a main module and an exchangeable connection module.

U.S. Pat. No. 6,456,495 B1 discloses a logic-control system consisting of self-contained device modules. The device modules are plugged onto a DIN rail.

DE 10 2014 111 031 A1 discloses a control system comprising a coupling unit and a coupling module, wherein the coupling module has a first module connection and a module-encoding device. The coupling module has a coupling connection and a coupling-encoding device, the first module connection contacting the coupling connection of the coupling unit. The module encoding device is arranged adjacent to the first module connector, the module-encoding device, in conjunction with the coupling-encoding device of the coupling unit, defining a type of module which may be connected to the coupling unit. The coupling unit has a printed-circuit board which is individually manufactured for the control system in an application-specific manner and in which the module coding device is integrated.

The disadvantage of this embodiment of the control system is that there is no possibility of connection to flexibly expand the coupling unit. Furthermore, in the disclosed embodiment of the coupling unit, a control module is connected to the coupling module via a data cable. For this reason, the control system cannot be fully tested for functionality prior to installation in an automation system so that the automation system to be installed remains at a standstill for a longer period of time.

Another control system with an application-specific coupling unit is e.g. known from DE 10 2014 111 030 B4, as well.

SUMMARY

The invention provides a flexibly expandable control system that may quickly be incorporated into an automation system. Furthermore the invention provides an improved coupling module and an improved method of mounting such a control system for an automation system.

According to one aspect the control system comprises a signal-distribution board, a top-hat rail, at least a first contact device and at least a second contact device, wherein the first contact device and the second contact device are arranged at an offset with regard to each other on the signal-distribution board and the signal-distribution board electrically connects the first contact device to the second contact device at least for transmitting data. The top-hat rail is mechanically fixed to the signal-distribution board. A first coupling module may be mechanically fastened to the top-hat rail. The first contact device is embodied to electrically contact a signal-processing module or a second coupling module, wherein the first contact device may be electrically connected to a field device.

According to another aspect, a method of mounting a control system is provided, wherein the signal-distribution board, the first coupling module and the control module are provided, wherein the first coupling module is mounted on the top-hat rail in a first mounting movement preferably perpendicular to the signal-distribution board, and the first connector (or connecting means) connects the first coupling module to the top-hat rail in a form fit, wherein the control module is mounted on the top-hat rail in a second mounting movement preferably perpendicular to the signal-distribution board and the further connector (or connecting means) connects the control housing to the top-hat rail in a form fit.

EXEMPLARY EMBODIMENTS

The control system comprises a signal-distribution board, a top-hat rail, at least a first contact device and at least a second contact device, wherein the first contact device and the second contact device are arranged at an offset with regard to each other on the signal-distribution board and the signal-distribution board electrically connects the first contact device to the second contact device at least for transmitting data. The top-hat rail is mechanically fixed to the signal-distribution board. A first coupling module may be mechanically fastened to the top-hat rail. The first contact device is embodied to electrically contact a signal-processing module or a second coupling module, wherein the first contact device may be electrically connected to a field device.

This embodiment has the advantage that if the signal-distribution board is embodied as an application-specific printed-circuit board, the control system may be flexibly expanded by the first coupling module which may be arranged on the top-hat rail and, if the case may be, by further modules which may be arranged on the top-hat rail. In addition, the forces acting upon the signal-distribution board may be kept low by directly arranging the top-hat rail on the signal-distribution board. This prevents deflection of the signal-distribution board.

In another embodiment, the signal-distribution board has a printed-circuit board, wherein the printed-circuit board has at least one printed-circuit board layer with an electrically insulating material. The electrically insulating material preferably comprises a fibre-reinforced plastic. The printed-circuit board has at least one conductor-path layer made of an electrically conductive material arranged on the circuit-board layer, the circuit-board layer being embodied to support mechanical forces from the top-hat rail and the conductor-path layer being embodied to electrically connect the first contact device to the second contact device.

In a further embodiment, the printed-circuit board has a plurality of printed-circuit board layers, wherein between each of the printed-circuit board layers a conductor-path layer consisting of an electrically conductive material is arranged, wherein the conductor-path layer and the printed-circuit board layers are arranged in a stack in an alternating manner. This ensures high mechanical stiffness and load-bearing capacity. Furthermore, the contact devices may well be electrically connected to each other.

In a further embodiment, the control system comprises a first coupling module having a first housing, a third contact device and a first detachable connector, wherein a first recess is arranged on a first housing rear side of the first housing, the top-hat rail engaging with the first recess. The first connector is connected to the first housing and is embodied to engage with the top-hat rail for non-destructive, reversibly detachable fastening of the first housing to the top-hat rail. The third contact device is arranged at the first housing and embodied to transmit data. As a result, the first coupling module may be mounted and disassembled particularly easily without specific tools. The coupling module may, for example, convert data being of different telegram types or having different signal representation. The coupling module is particularly suitable for converting, e.g. during passage, a first telegram type of a first signal representation, e.g. Ethernet-10 Base Tx, to a second telegram type of a second signal representation, e.g. an E-bus signal representation.

It is of particular advantage if the third contact device on the first rear side of the housing is arranged at an offset with regard to the first connector in a direction perpendicular to a longitudinal extension of the first recess.

In another embodiment, the first coupling module has a first data-contact device at a first housing-side face of the first housing, the first housing-side face preferably being arranged perpendicularly with regard to the signal-distribution board, wherein the first data-contact device is coupled to the third contact device for data transmission.

In a further embodiment, the control system has a power-supply connection arranged at the signal-distribution board, the signal-distribution board electrically connecting the power-supply connection to the second contact device. The second coupling module electrically contacts the second contact device for transmitting data and for supplying the second coupling module with power. As a result, the second coupling module may be supplied with power in a particularly simple manner without the need for further contact devices. In addition, the power-supply connection may also be connected to the first contact device so that sensors and/or actuators may be supplied with electrical energy provided by the supply connection via the signal-distribution board.

In a further embodiment, the first coupling module comprises at least a first power-supply contact and at least a second power-supply contact on the first housing-side face, wherein the first power-supply contact may be directly or indirectly connected to a first pole of a DC-voltage source and the second power-supply contact may be connected directly or indirectly to a second pole of the DC-voltage source, wherein the first power-supply contact is electrically connected to a first contact element of the third contact device and the second power-supply contact is electrically connected to a second contact element of the third contact device for transmitting supply power to the signal-distribution board. Thus, the power supply of the first coupling module and of the signal-distribution board may be provided in a simple manner.

In a further embodiment, the first electrical power-supply contact and/or the second electrical power-supply contact is board-shaped and protrudes over the first housing-side face. The first power-supply contact and/or the second power-supply contact has a first long side perpendicular to the signal-distribution board. This allows for the first and/or second power-supply contact to contact another module during mounting of the modules in the mounting movement.

In a further embodiment, the third contact device comprises at least a third contact element, the third contact element being coupled to the first data-contact device for transmitting data. As a result, both data and electrical energy for supplying power to the first coupling module and/or the signal-processing module are transmitted by the third contact device.

The signal-distribution board has a first board area, a second board area and a third board area on a board front side, the board areas being arranged adjacent to one another. In the first board area the top-hat rail is arranged. In the second board area, a plurality of second contact devices, preferably identical to each other, and in the third board area a plurality of first contact devices are arranged. This embodiment has the advantage that the control system may be connected to several field devices simultaneously. Furthermore, several signal-processing modules may be arranged in the second board area that may process data provided by the field devices or data to be processed. This makes it particularly easy to adapt the control system to the automation system.

In a further embodiment, the control system has a second coupling module, wherein the second coupling module is mechanically connected to the signal-distribution board by a fastener (or fastening means). The second coupling module is electrically connected to the third contact device of the first coupling module for transmitting data, preferably by a data cable. By the two coupling modules, the control system may easily be extended to control further field devices, for example having E-bus signal representation.

In a further embodiment, the control system has a fourth contact device arranged at the signal-distribution board, the signal-distribution board electrically connecting the fourth contact device to the first contact device and/or the second contact device at least for transmitting data. The fourth contact device is arranged adjacent to the top-hat rail on a board-front side of the signal-distribution board facing the top-hat rail, the third contact device being arranged on a housing rear side of the first housing facing the signal-distribution board, and the third contact device of the first coupling module electrically contacting the fourth contact device for transmitting data and/or power. As a result, when the first coupling module is plugged onto the top-hat rail, the electrical connection between the signal-distribution board and the first coupling module may be established so that a number of working steps in the assembly is particularly small. Furthermore, the arrangement of the first coupling module in the transverse direction is defined by the third and fourth contact device so that positioning the first coupling module on the top-hat rail may be carried out in a particularly simple manner.

In a further embodiment, the control system comprises a control module, the control module having at least one control device for carrying out a control process, a control housing accommodating the control device and a reversibly detachable further connector, the control module being mounted on the top-hat rail, the further connector being connected to the control housing and embodied to engage behind the top-hat rail in areas for the non-destructive reversible detachable fastening of the control housing to the top-hat rail. This provides a particularly compact control system that may be flexibly expanded and tested in advance so that it may be optimally installed as a complete unit in the automation system at a later point in time. The control module can, for example, be embodied as a top-hat rail PC, in particular as an industrial PC integrated in the control housing embodied as a top-hat rail housing. By coupling the control module to the first coupling module, additional extension (coupling) modules are not required. The control module may also be directly extended by at least one terminal module, for example by EtherCAT terminals.

In a further embodiment, the control housing has at least a first groove on a first control-housing-side face facing the first housing-side face of the first housing. The control module has at least one first slot contact, the first slot contact being arranged in the first groove. The first groove is embodied to guide the first power-supply contact in a mounting movement wherein the first slot contact contacts the first power-supply contact of the first coupling module for supplying power to the first coupling module. As a result, additional contacting steps for electrically connecting the first coupling module to the control module may be dispensed with. The control module may have an integrated power-supply unit through which the voltage required at the power-supply contacts may be provided by the control module for the first coupling module.

In a further embodiment, the control housing has at least one second groove on the first side face of the control housing that is arranged in an offset manner with regard to the first groove. The first groove and the second groove are preferably arranged perpendicular with regard to the signal-distribution board. Furthermore, the first groove and the second groove have a predefined distance from each other, the predefined distance corresponding to a distance between the first power-supply contact and the second power-supply contact.

In a further embodiment, the control module has a second data-contact device at the first control-housing-side face, the second data-contact device being embodied to correspond to the first data-contact device of the first coupling module and being electrically connected to the first data-contact device for transmitting data. The second data-contact device is electrically connected to the control device for processing data which may be transmitted by the first and second data-contact devices.

In a further embodiment, the control module has at least a feed connection with at least a first feed contact on a control-housing-front side of the control housing facing away from the signal-distribution board, the first feed contact being electrically connectable to a power supply. The first slot contact is electrically connected to the first feed contact. In order to connect the first power-supply contact to the first slot contact, the control module may have an internal power supply unit which transforms the voltage between the first feed contact and the first slot contact. Alternatively, the first power-feed contact may be directly electrically connected to the first slot contact.

For mounting the control system described above, the signal-distribution board, the first coupling module and the control module are provided, wherein the first coupling module is mounted on the top-hat rail in a first mounting movement, preferably perpendicular to the signal-distribution board, and the first connector connects the first coupling module to the top-hat rail in a form fit, wherein the control module is mounted on the top-hat rail in a second mounting movement, preferably perpendicular to the signal-distribution board, and the further connector connects the control housing to the top-hat rail in a form fit. This allows for the control system to be mounted particularly quickly and without specific tools, even outside of the automation system.

It is of particular advantage if the third contact device is inserted into the fourth contact device when the first coupling module is plugged onto the top-hat rail.

BRIEF DESCRIPTION OF THE DRAWINGS

The invention will be discussed in more detail below on the basis of figures. Here, in a schematic illustration in each case.

DETAILED DESCRIPTION

In the figures, reference is made to a coordinate system for easier understanding. The coordinate system is embodied as a right-handed system and has an x-axis (longitudinal direction), a y-axis (transverse direction) and a z-axis (height direction).

Figure 1:
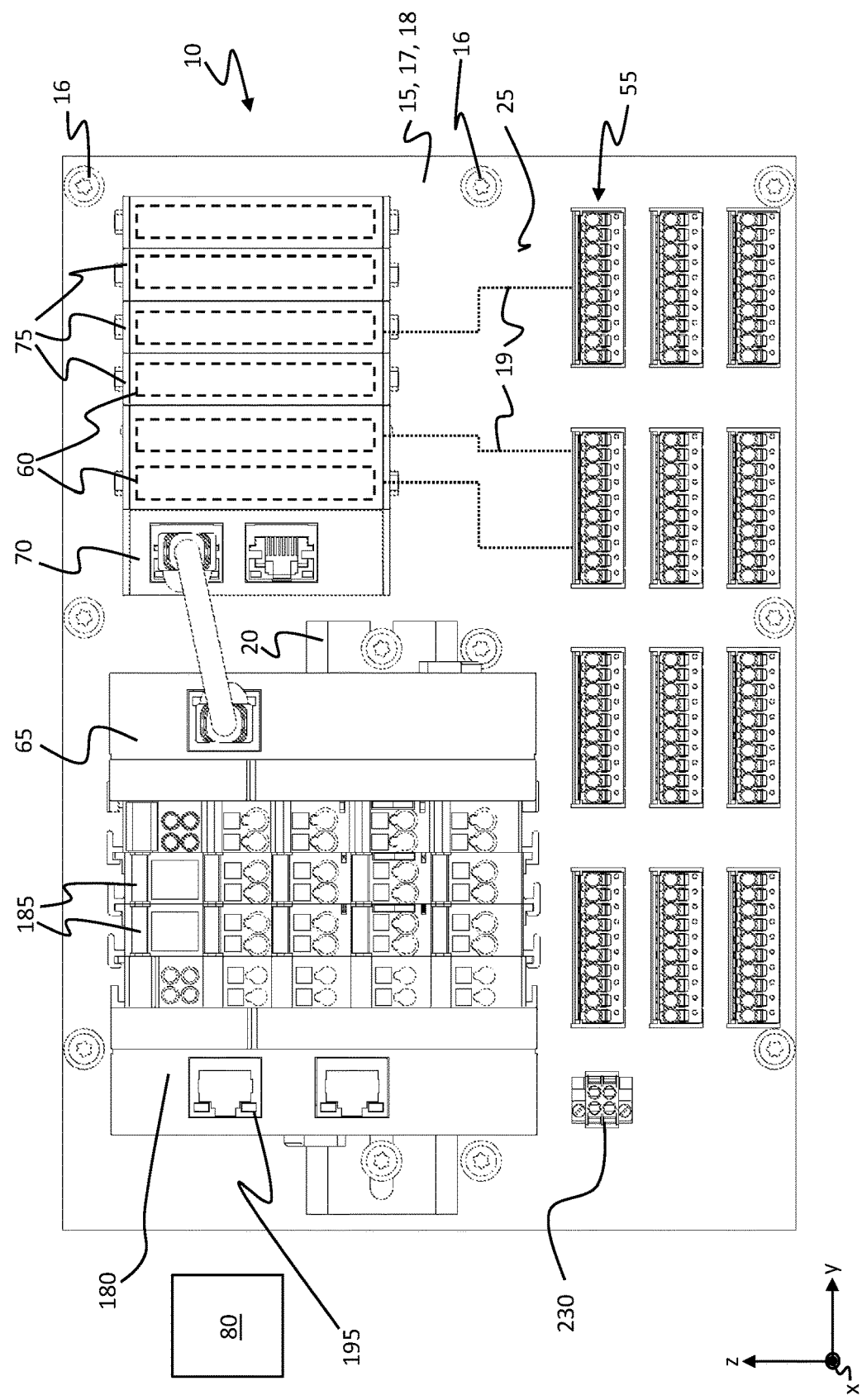
FIG. 1 shows a front view of a control system according to a first embodiment.

FIG. 1 shows a front view of a control system 10 according to a first embodiment for an automation system.

The control system 10 may be part of the automation system and is used for automated control of field devices. In industrial process automation, field devices include actuators, such as drives or valves, and measuring transducers, such as encoders and sensors.

The control system 10 has a signal-distribution board 15. The signal-distribution board 15 may, for example, be mounted vertically in a switching cabinet of the automation system. In front view, the signal-distribution board 15 has an exemplary rectangular embodiment and is non-destructively detachably connected to a rear board of the switching cabinet by connecting screws 16. The signal-distribution board 15 has a significantly smaller extension in the x-direction than in the y-direction or z-direction.

The signal-distribution board 15 comprises a printed-circuit board 17, the printed-circuit board 17 having at least one printed-circuit board layer 18 consisting of an electrically insulating material, preferably of a glass-fiber-reinforced plastic. Preferably, the printed-circuit board 17 has several printed-circuit-board layers 18. Between the circuit board layers 18 at least one conductor-path layer 19 (indicated as a dotted line in FIG. 1) of an electrically conductive material is arranged. The conductor-path layer 19 and the printed-circuit-board layers 18 may be arranged in an alternating manner in a stack.

Preferably, the signal-distribution board 15 comprises four or more conductor-path layers 19, all of which are arranged inside of the signal-distribution board 15, for example in a laminated manner. Due to the multi-layer structure, and preferably due to the circuit-board layers 18 formed by fiber composites, the signal-distribution board 15 is mechanically rigid. This means that additional stiffening elements may be dispensed with on the signal-distribution board 15 in order to achieve a predefined stiffness of the signal-distribution board 15.

The control system 10 furthermore comprises at least one, preferably a plurality of, first contact devices 55 and at least one, preferably a plurality of, second contact devices 60 (indicated by dashes in FIG. 1). The first and second contact devices 55, 60 are arranged on a board-front face 25 of the signal-distribution board 15 and are electrically connected to each other by the conductor-path layer 19.

In addition, the control system 10 according to the first version also comprises a top-hat rail 20, a first coupling module 65, a second coupling module 70, preferably one or a plurality of signal-processing modules 75, preferably a third coupling module 180, preferably one or a plurality of terminal modules 185 and a control module 80. The control module 80 may be connected to a second data connection 195 of the third coupling module 180 via a data cable in FIG. 1 in order to exchange data between the control module 80 and the third coupling module 180 for controlling the automation system.

In addition, a supply connection 230 may be arranged at the signal-distribution board 15, the signal-distribution board 15 electrically connecting the supply connection 230 at least to the second contact device 60. Furthermore, the supply connection 230 may also be electrically connected to the first contact devices 55 via the signal-distribution board 15. The supply connection 230 may, for example, be electrically connected to a DC-voltage source.

Figure 2:
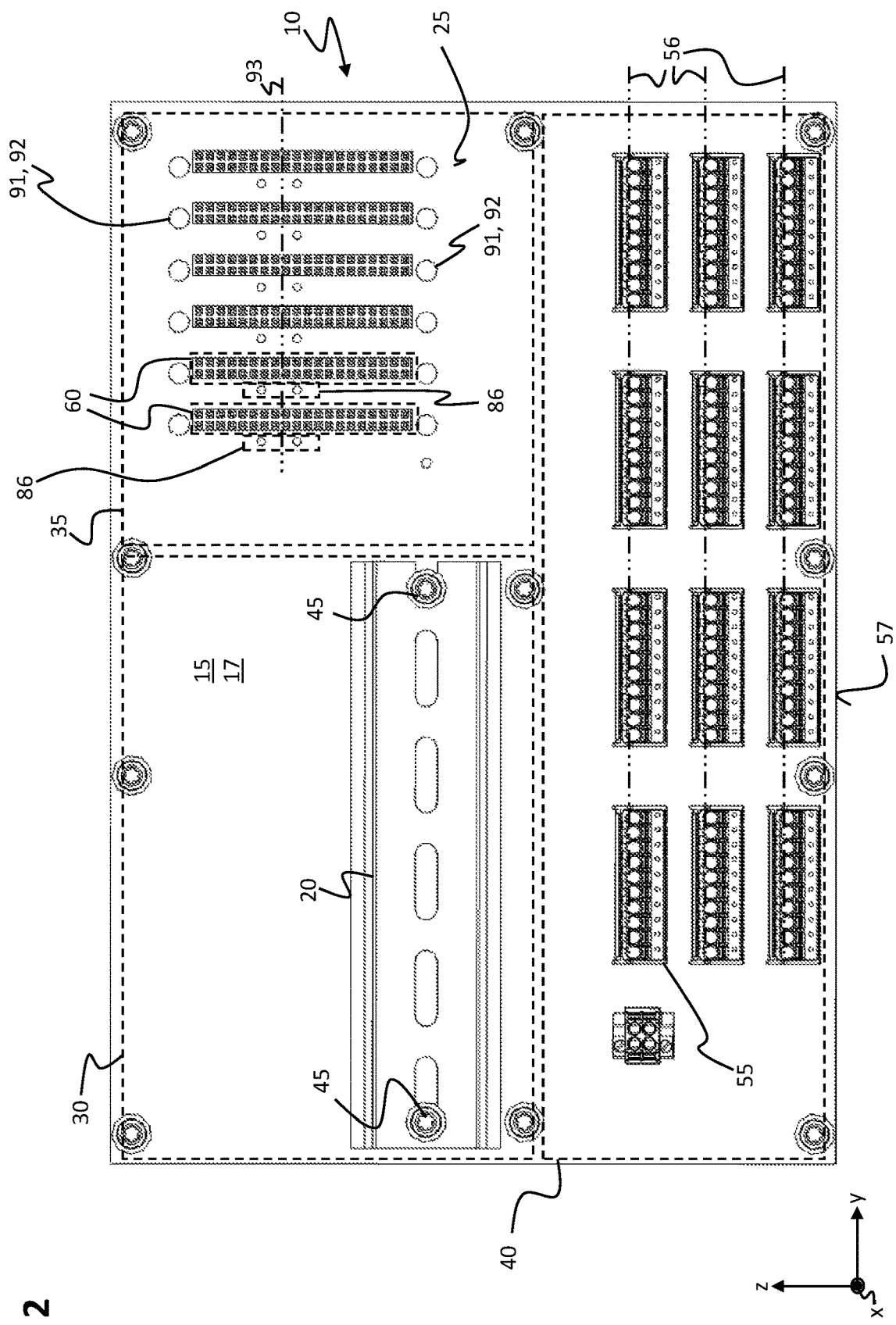
FIG. 2 depicts a front view of the control system shown in FIG. 1.

FIG. 2 shows a front view of the control system 10 of FIG. 1. In FIG. 2, the first coupling module 65, second coupling module 70, signal-processing module 75, control module 80 and terminal module 185 are depicted in FIG. 1.

The signal-distribution board 15 is, at the board-front face 25, divided up into a first board area 30, a second board area 35 and a third board area 40.

The first to third board areas 30, 35, 40 abut on each other. (In FIG. 2, the board areas are shown slightly distanced with regard to one another apart for easy identification). In FIG. 2, the first board area 30 is exemplarily arranged on the left-hand side and above the third board area 40, and the second board area 35 is exemplarily arranged on the right-hand side of the first board area 30 and above the third board area 40. The third board area 40 extends over the entire width of a lower partial area of the signal-distribution board 15.

In the first board area 30, the control system 10 comprises the top-hat rail 20. The top-hat rail may e.g. be embodied according to DIN EN 50022. The top-hat rail 20 may, in its main direction of extension, be aligned in parallel to a lower edge 57 of the signal-distribution board 15. The top-hat rail 20 is mechanically connected to the signal-distribution board 15 by a screw connection 45, for example by two screws arranged at the respective end of the top-hat rail 20. The top-hat rail 20 may be located approximately in the lower third of the first board area 30. In the transverse direction, e.g. the y-direction, the first board area 30 extends over approximately two thirds of the total width of the signal-distribution board 15. No first and/or second contact devices 55, 60 are arranged in the first board area 30.

In the third board area 40 the control system 10 comprises at least the first contact device 55. The first contact device 55 is in its main direction of extension aligned in the transverse direction, e.g. in the y-direction.

Preferably, several first contact devices 55 arranged in a grid pattern are provided, wherein the first contact devices 55 are each exemplarily identical or different from one another. In the embodiment, a plurality of first contact devices 55 are arranged, for example, in three first rows 56 arranged one below the other and running parallel to the lower edge 57 of the signal-distribution board 15, in each case offset with regard to one another in the transverse direction. A gap is respectively provided between the individual first contact devices 55 to allow for a cable contact device arranged on a first connecting cable to be pushed onto the first contact device 55. The grid-like arrangement, embodiment and number of the first contact devices 55 shown in FIG. 2 are examples and may be adapted according to the application and embodiment of the signal-distribution board 15.

Each of the first contact devices 55 may be embodied as a plug-in contact with several male contact plugs. The first contact device 55 may be electrically connected to the field device by the first connecting cable. The field device may be an electrical machine, a valve, a sensor or a relay. The embodiment of the sensor is freely selectable. The sensor serves e.g. to detect a state of a component of the automation system.

In the second board area 35, the control system 10 comprises at least the second contact device 60, preferably several second contact devices 60 arranged next to each other in the transverse direction, e.g. in the y-direction, wherein the second contact devices 60 may be embodied identically to each other. Each of the second contact devices 60 may have at least one, preferably a plurality of through-contacts arranged at regular intervals. A main direction of extension of the second contact device 60 runs in the vertical direction, e.g. in the z-direction, and is thus exemplarily inclined, preferably perpendicularly, with regard to the main direction of extension of the first contact device 55.

An encoding device 86 may be arranged laterally in the transverse direction next to each second contact device 60, wherein the encoding device 86 has recesses arranged in the printed-circuit board 17 depending on an allocation of the second contact device 60. The encoding device 86 serves to ensure that only one signal-processing module predefined on the second contact device 60 or a second coupling module assigned according to the allocation of the second contact device 60 may be arranged. The encoding device 86 thereby prevents a signal-processing module which does not have the corresponding allocation for the second contact device 60 and is therefore not suitable for being attached to the corresponding position of the signal-distribution board 15 from being plugged on.

In the z-direction on the top and bottom side of the second contact device 60, a through-hole 91 of a fastener (or fastening means) 92 is respectively arranged (for example also recognizable in FIG. 6), wherein the through-hole 91 is penetrated by a lock (or locking means) of the fastener 92 in the mounted state of the second coupling module 70 and/or the signal-processing module 75 and the signal-distribution board 15 being gripped behind by the lock in order to detachably fasten the signal-processing module 75 and/or the second coupling module 70 to the signal-distribution board 15 in a form fit.

The second contact devices 60 and the encoding devices 86 are in FIG. 2 alternatingly arranged next to each other in the transverse direction, e.g. in the y-direction parallel to the lower edge 57 in a second row 93. The distance between the individual second contact devices 60 may be adapted in accordance with a width of the signal-processing module and/or second coupling module to be mounted on the respective second contact device 60 and may differ with regard to one another. The number of second contact devices 60, too, may be selected according to the application. If more than the number of second contact devices 60 shown in FIG. 2 is required for the connecting the signal-processing modules, the signal-distribution board 15 may e.g. be extended in the transverse direction with regard to the embodiment shown in FIG. 2.

The signal-distribution board 15 distributes data signals and a power supply to the first and second contact devices 55, 60 and between the first and second contact devices 55, 60.

Figure 3:
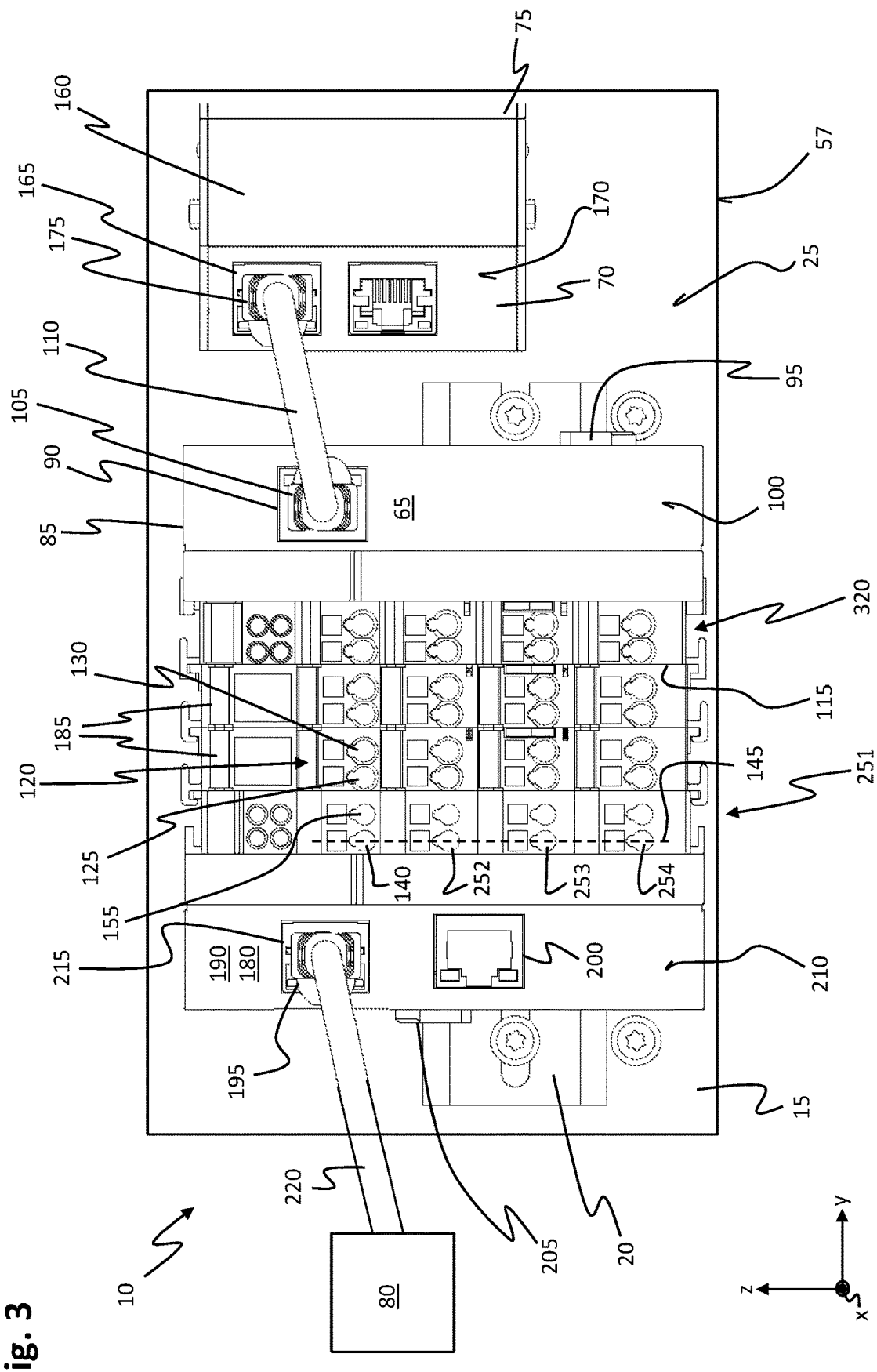
FIG. 3 shows an enlarged section of the front view of the control system of FIG. 1.

FIG. 3 shows a magnified section of the first board area 30 and part of the second board area 35 adjoining the first board area 30 in the y-direction of the front view of the control system 10 shown in FIG. 1.

The first coupling module 65 is located on a side of the top-hat rail 20 facing the second board area 35 shown in FIG. 2. The type of the first coupling module 65 may be an EK1110 manufactured by Beckhoff Automation GmbH & Co. KG.

The first coupling module 65 has a first housing 85, a third contact device 90 and a first connector 95. The first connector 95 is arranged on a first housing-rear side of the first housing 85 facing the board-front side 25 and connects the top-hat rail 20 to the first housing 85 in a non-destructive, reversible and detachable manner.

The third contact device 90 is exemplarily arranged at a first housing-front face 100 of the first housing 85. The third contact device 90 may e.g. be embodied as an RJ45 socket. The third contact device 90 is in the embodiment of the first coupling module 65 exclusively configured for transmitting data, wherein in FIG. 3 a first plug 105 of a first data cable 110 is inserted into the third contact device 90.

In addition, a dummy-field connection 320 which has no electrical allocation may be arranged adjacent to a first housing-side face 115 of the first housing 85 on the first housing-front face 100. The dummy-field connection 320 has the geometrical configuration of a field connection 120 of the terminal module 185; however, it has no electrical connection to other electrical components.

The second coupling module 70 is located on the left side in the second board area 35 shown in FIG. 2 and has a second housing 160 and at least one first data connection 165. The first data connection 165 is located on a second housing-front face 170 of the second housing 160, which is located on a side of the second housing 160 facing away from the board-front face 25. The first data connection 165 is exemplarily embodied like an RJ45 socket. When the control system 10 is assembled, a second plug 175 of the first data cable 110 contacts the first data connection 165 and connects the first coupling module 65 with the second coupling module 70 for transmitting data. In this case, there is no transmission of supply power between the third contact device 90 and the first data connection 165.

At the rear of the second housing 160 (concealed in FIG. 3), on a side facing the board-front side 25, the second coupling module 70 and each of the signal transmission modules 75 respectively have a further contact device (also concealed in FIG. 3), the further contact device being embodied to correspond to the second contact device 60 and electrically contacting the second contact device 60.

In this context, the further contact device connects the second coupling module 70 for transmitting data to the second contact device 60 and in addition the second coupling module 70 is supplied with electrical supply power from the electrical power fed in via the supply connection 230 by the signal-distribution board 15 and the second contact device 60.

On the right-hand side, in the second area of the board 35, a plurality of signal-processing modules 75 are connected to the second coupling module 70 as an example, each of which also has the further contact device on the rear side which respectively contacts the assigned second contact device 60 for transmitting data, but also for supplying power to the respective signal-processing modules 75. Due to the enlarged depiction, only a small section of a signal-processing module 75 is shown in FIG. 3.

In addition, the control system 10 in the embodiment comprises the third coupling module 180, wherein the third coupling module 180 is in the embodiment attached to the left side of the first coupling module 65 on the top-hat rail 20. One or a plurality of terminal modules 185 may be arranged in the transverse direction between the third coupling module 180 and the first coupling module 65, wherein the number of terminal modules 185 may be selected according to the embodiment of the control system 10. Terminal modules 185 may also be dispensed with, so that the first coupling module 65 and the third coupling module 180 are arranged directly next to each other.

The third coupling module 180 has a third housing 190, a second data connection 195, preferably a third data connection 200 and a second connector (or connecting means) 205.

On a second rear side of the third housing 190, the second connector 205 connects the third housing 190 to the top-hat rail 20 in a non-destructive, reversible and detachable manner. The third housing 190 may also rest on the board-front side 25 in certain areas so that bending stress on the signal-distribution board 15 due to forces and moments acting upon the signal-distribution board 15 from the third housing 190 is low.

The second and third data connections 195, 200 are arranged at an offset with regard to each other in the height direction, e.g. the z-direction, on a second housing-front face 210 of the third housing 190. The second and/or third data connection 195, 200 may be embodied as an RJ45 socket. In this context, the second data connection 195 may be embodied as an input of an EtherCAT network and the third data connection 200 as an output of the EtherCAT network in order to expand the EtherCAT network. In this case, the third data connection 200 may be connected to another coupling module.

In a mounted state, a third plug 215 of a second data cable 220 engages in the second data connection 195. The second data cable 220 connects the third coupling module 180 with the control module 80 in terms of data, which in the embodiment is located at a distance from the signal-distribution board 15, for example in another part of the switching cabinet.

The third coupling module 180 may be of the EK1100 type manufactured by Beckhoff Automation GmbH & Co. KG. In addition, the third coupling module 180 has a feed connection 251 as an example.

The feed connection 251 is arranged at the second housing-front face 210 on a side facing the first coupling module 65 (in transverse direction). The feed connection 251 comprises at least a first feed contact 252 and at least a second feed contact 253. Preferably, the feed connection 251 has a third feed contact 254 in addition to the first and second feed contacts 252, 253, wherein in the embodiment the first to third feed contacts 252, 253, 254 are exemplarily arranged one above the other in a third row 145. The third row 145 e.g. extends perpendicularly to the lower edge 57 of the signal-distribution board 15. In addition, as shown in FIG. 3, the first to third feed contacts 252, 253, 254 may be doubled so that two first to third feed contacts 252, 253, 254 arranged next to each other are provided.

The first to third feed contacts 252, 253, 254 may be embodied as terminal contacts. The first feed contact 252 may be electrically connected to a first pole, in particular to a positive pole, of an electrical DC-voltage source. In FIG. 3, the second feed contact 253 is arranged below the first feed contact 252. The second feed contact 253 may be connected in a second pole, for example a negative pole of the DC-voltage source. The third feed contact 254 is arranged below the second feed contact 253, wherein the third feed contact 254 may e.g. be electrically connected to an electrical ground.

In addition, the feed connection 251 may have a fourth and fifth feed contact 140, 155 on the upper side of the first feed contact 252, wherein the fourth feed contact 140 and the fifth feed contact 155 are arranged next to each other in the transverse direction and may be connected to an internal power supply unit of the third coupling module 180.

In the embodiment, the first coupling module 65 and the third coupling module 180 are, in terms of data, connected to the terminal modules 185 arranged between the first and third coupling module 180 and via the terminal modules 185. In this context, the data connection between the first and third coupling module 65, 180 is looped through the terminal modules 185.

The terminal module 185 may be embodied as an input terminal module and/or an output terminal module. The terminal module 185 may be of the EL-series type manufactured by Beckhoff Automation GmbH & Co. KG.

The embodiment of the terminal modules 185 may differ depending on the purpose of application. For example, the terminal module 185 shown on the left-hand side in FIG. 3 may be an input-terminal module and the terminal module 185 arranged on the right-hand side of the first coupling module 65 may be an output-terminal module. Thus, the left-sided terminal module 185 may be an EL1252 type and the right-sided terminal module 185 may be an EL2252 type by Beckhoff Automation GmbH & Co. KG. The terminal module 185 has a field connection 120 with a first field contact 125 and a second field contact 130, wherein the first field contact 125 and the second field contact 130 are exemplarily arranged next to each other in the transverse direction and comprise terminals connecting of one connecting line to the field, respectively. During operation, the terminal module 185 acquires a control signal from a process level and transmits it, in a galvanically isolated manner, to the superordinate coupling module 65, 180. Electrical power is supplied to the terminal module 185 via the third coupling module 180. The embodiment of the terminal modules 185 may furthermore differ in terms of the number of channels and the terminal allocation of the terminal module 185 at the field connection 120.

If the terminal module 185 is embodied as an output terminal module, the terminal module 185 switches output signals of the controller to the process level in a galvanically isolated manner. The first field contact 125 may be embodied as an output. The first field contact 125 is switched in a highly precise manner to match the transmitted time stamp so that switching times at the output may be precisely specified throughout the system. Each first and second field contact 125, 130 may be individually switched to high resistance.

In the embodiment, the third terminal module 185 e.g. converts the signal representation from Ethernet 100BASE-TX or EtherCAT to the E-bus signal representation for the terminal module 185, the first and second coupling modules 65, 70 and the signal-processing modules 75 during passage.

The first coupling module 65 serves as a bus end terminal and for expanding the E-bus area to the second coupling module 70. For this purpose, the first coupling module 65 is connected to the second coupling module 70 by the first data cable 110. Power is supplied to the first coupling module 65 via the terminal modules 185 from the third coupling module 180.

The second coupling module 70 and the at least one signal-processing module 75 are supplied with electrical power at the rear from the supply connection 230 via the signal-distribution board 15. Furthermore, the second coupling module 70 and the at least one signal-processing module 75 are connected to each other in terms of data technology via the second contact devices 60 and the signal-distribution board 15. The second coupling module 70 may be of the EJ1100 type by Beckhoff Automation GmbH & Co. KG. The second coupling module 70 connects the signal-processing modules 75 with the first coupling module 65 in terms of data.

By supplying the second coupling module 70 and/or the signal-processing module 75 via the supply connection 230, only data between the first data connection 165 and the third contact device 90 are transmitted via the first data cable 110.

The signal-processing module 75 may be embodied identically to the terminal module 185 in terms of functionality, wherein the signal-processing module 75 is connected to the first contact device 55 via the further contact device and the second contact device 60 and the signal-distribution board 15. The first contact device 55 in this context takes over the function of the field connection 120 and provides the electrical connection to field devices.

Similar to the terminal module 185, the signal-processing module 75 may be embodied as an input module having the functionality of the input-terminal module or as an output module with the functionality of the output-terminal module. The signal-processing module 75 may be of the EJ-series type manufactured by Beckhoff Automation GmbH & Co. KG.

Figure 4:
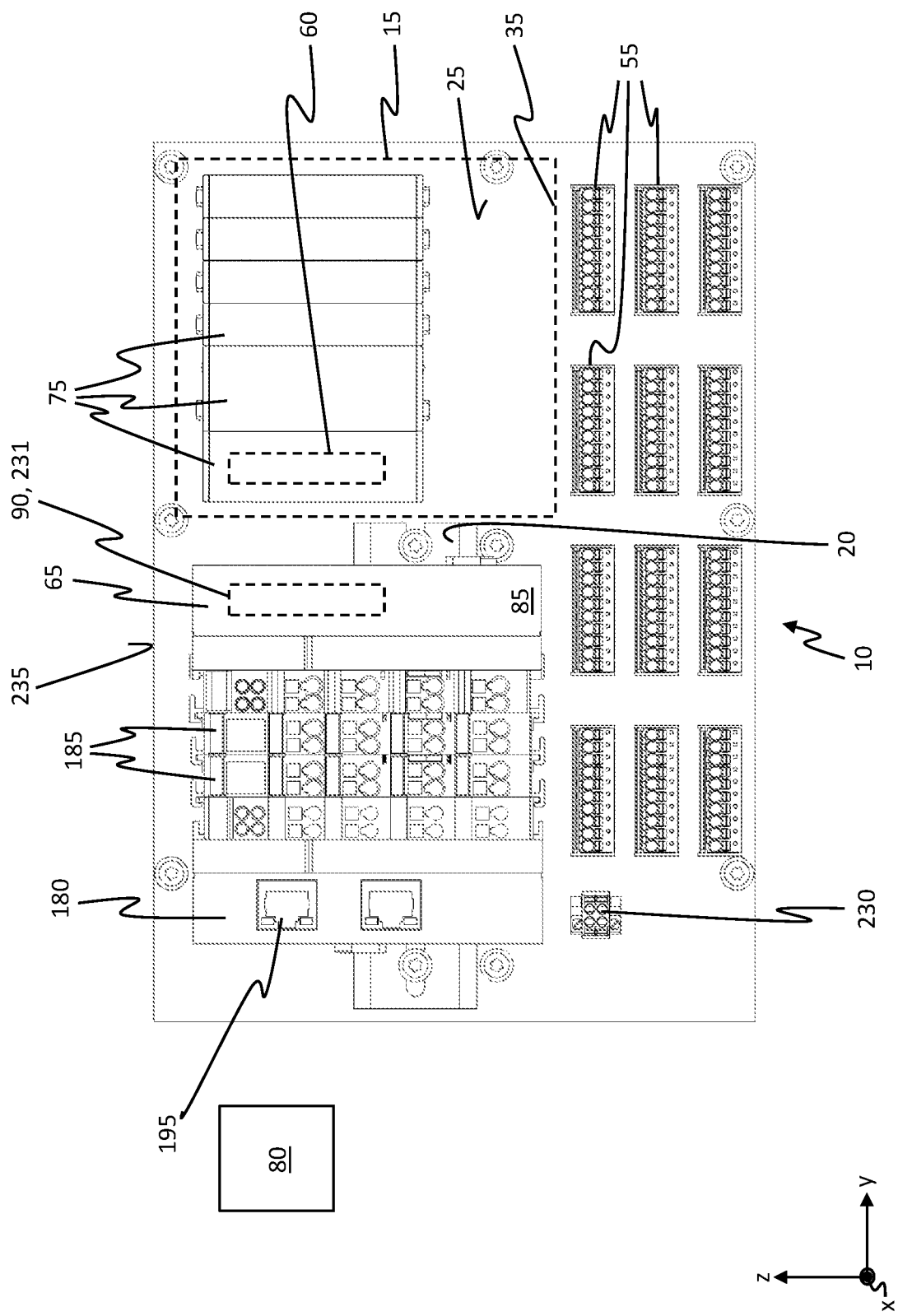
FIG. 4 shows a front view of a control system according to a second embodiment.

FIG. 4 shows a front view of a control system 10 according to a second embodiment.

The control system shown in FIG. 4 may be substantially identical to the control system 10 shown in FIGS. 1 to 3. In the following, only the differences between the control system 10 shown in FIG. 4 and the control system 10 shown in FIGS. 1 to 3 are discussed.

Furthermore, the first coupling module 65 in the embodiment shown in FIG. 4 is a combination of the first and second coupling module shown in FIGS. 1 to 3. The first coupling module 65 shown in FIG. 4 also takes over the function of the second coupling module 70 shown in FIGS. 1 to 3, so that one slot is free for the second coupling module 70 shown in FIGS. 1 to 3 in the second board area 35, and thus an additional signal-processing module 75 may be mounted in the slot of the second coupling module 70 shown in FIGS. 1 to 3.

In addition to the embodiment shown in FIGS. 1 to 3, the first coupling module 65 is further modified in that the third contact device 90 on the first housing-rear side (concealed in FIG. 4) is arranged at an offset with regard to the first connector 95.

Furthermore, the signal-distribution board 15 additionally comprises a fourth contact device 231 (depicted as a dashed line in FIG. 4), which is located on the board-front side 25 of the signal-distribution board 15. The third contact device 90 and the fourth contact device 231 are embodied in a corresponding manner with regard to each other, wherein e.g. the third contact device 90 comprises one or more contact elements arranged in rows, for example in the form of pins, and the fourth contact device 231 may be embodied as a through-contact. The third contact device 90 contacts the fourth contact device 231.

The fourth contact device 231 is electrically connected to the first contact device 55 and/or to the second contact device 60 at least for data transmission by the signal-distribution board 15. The fourth contact device 231 is arranged adjacent to the top-hat rail 20. In this context, the fourth contact device 231 is arranged in the height direction between the top-hat rail 20 and an upper board edge 235 of the signal-distribution board 15. The fourth contact device 231 is thereby preferably arranged closer to the top-hat rail 20 than to the upper board edge 235. The fourth contact device 231 has its main direction of extension in the height direction, e.g. in the z-direction. Similarly, in FIG. 4, the main direction of extension of the third contact device 90 is in the height direction, so that the first coupling module 65 may have a particularly slim embodiment in the transverse direction, e.g. in the y-direction.

Figure 5:
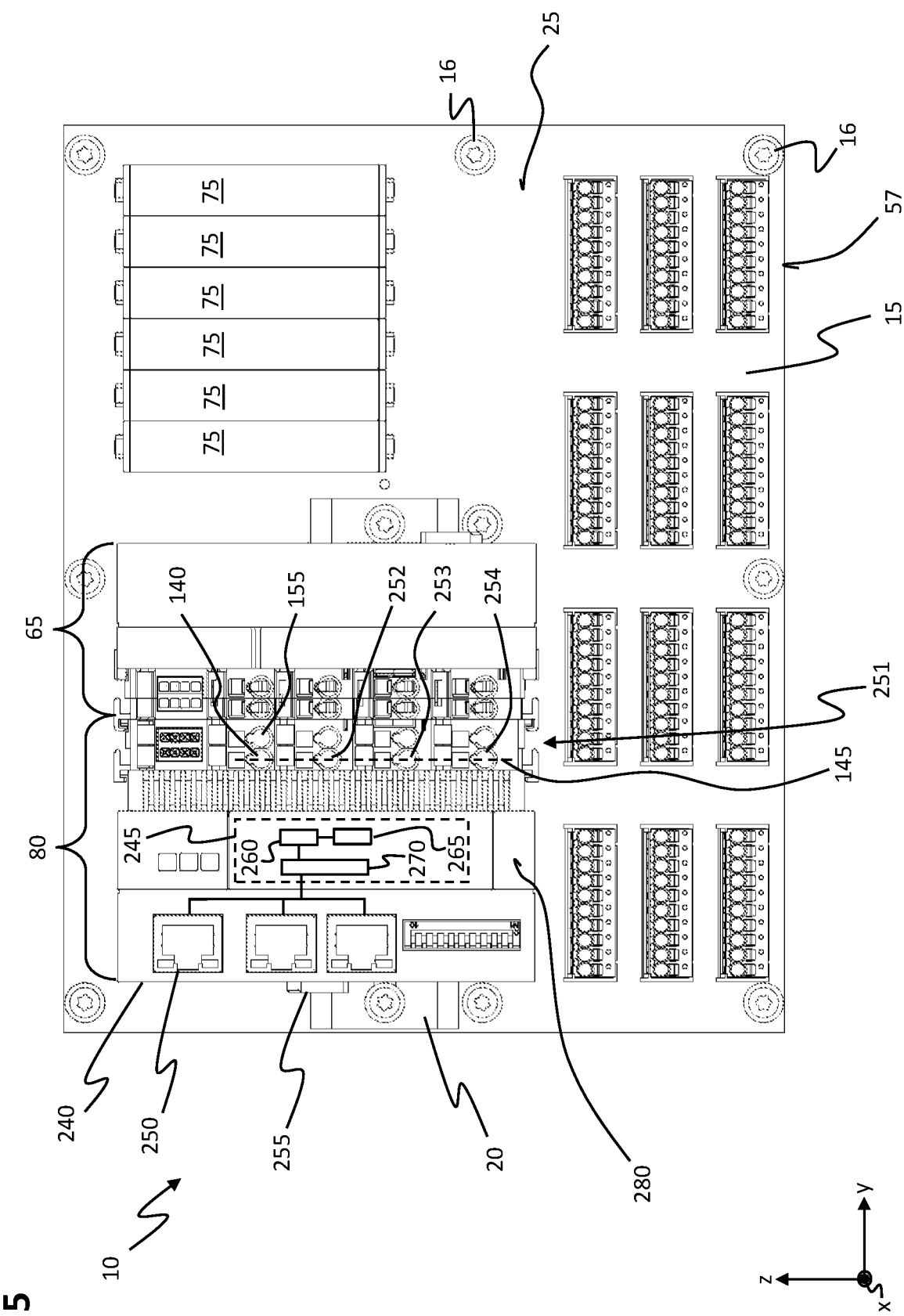
FIG. 5 is a front view of a control system according to a third embodiment.
Figure 6:
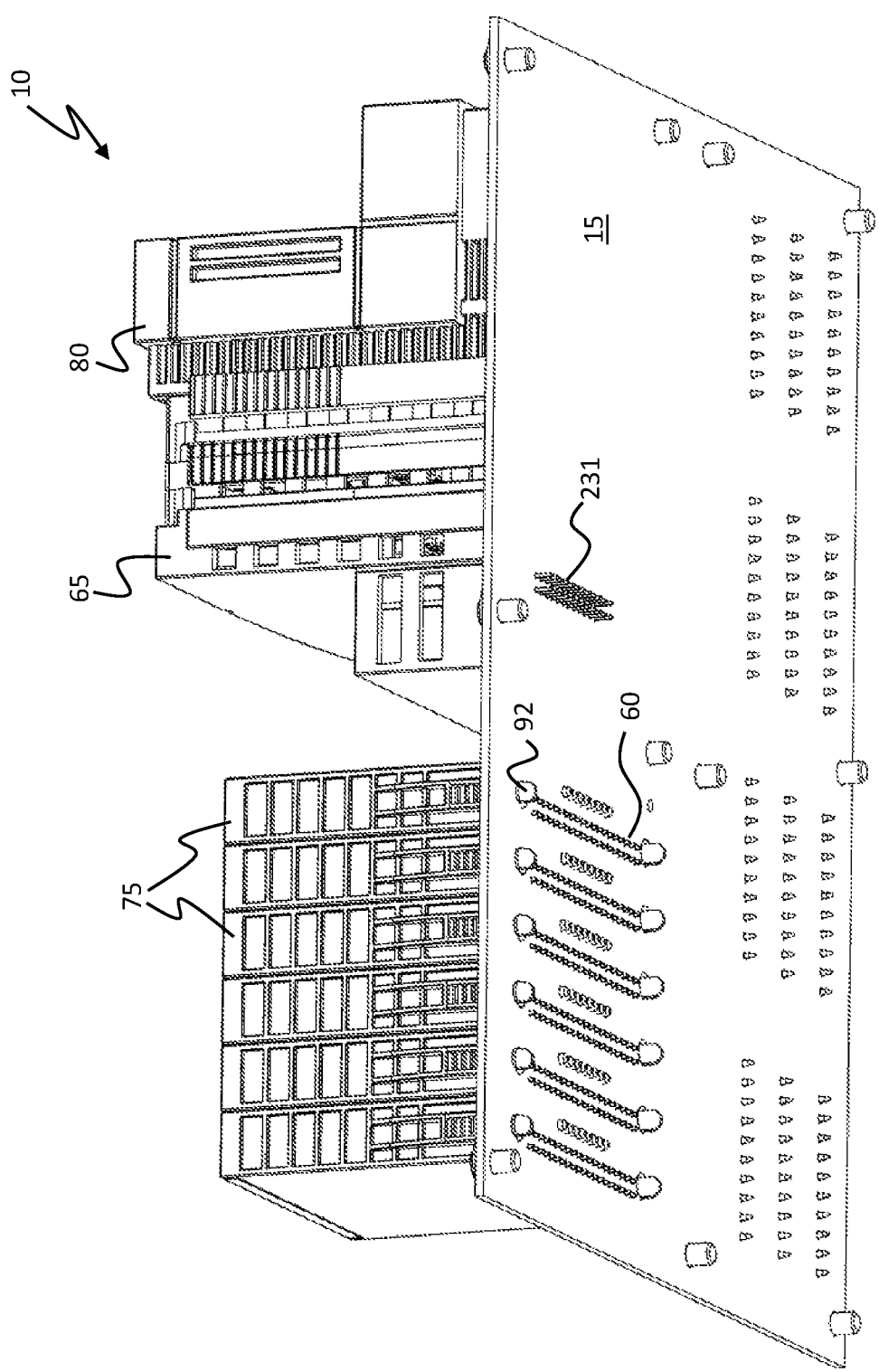
FIG. 6 shows a perspective rear view of the control system of FIG. 5.

FIG. 5 shows a front view of a control system 10 according to a third embodiment. FIG. 6 shows a perspective rear view of the control system 10 shown in FIG. 5.

The control system 10 shown in FIGS. 5 and 6 may be embodied substantially identically to the control system 10 shown in FIG. 4. In the following, only the differences between the control system 10 shown in FIGS. 5 and 6 and the control system 10 shown in FIG. 4 are described.

Instead of the third coupling module 180 shown in FIG. 4, control module 80 is located in the first board area.

The control module 80 comprises a control housing 240, a control device 245 enclosed in the control housing 240, at least one fourth data connection 250, the feed connection 251 and at least one third connector (or connecting means) 255 (also referred to as further connector in the claims).

The control housing 240 is reversibly and non-destructively connected to the top-hat rail 20 in a detachable manner by the third connector 255. Furthermore, at a control-housing-rear side the control housing 240 in areas abuts on the board-front side 25 of the signal-distribution board 15. The signal-distribution board 15 is so rigidly formed due to the stack of laminated circuit board layers that the signal-distribution board 15 supports all forces from the top-hat rail 20 on the switching cabinet via the screws 16. The stiffness of the signal-distribution board 15 may be defined by the number and/or thickness of the printed-circuit board layers, so that even when the control module 80, numerous terminal modules and the first coupling module 65 are arranged, bending or curving of the signal-distribution board 15 is avoided and even when the control module 80 is mounted, the signal-distribution board 15 extends in a y-z plane. This ensures secure fastening of the first coupling module 65 at the top-hat rail 20 and of the signal-processing modules 75 at the signal-distribution board 15.

The control module 80 may be embodied as an embedded PC and the control device 245 comprises a data memory 265, a computing device 260 and one or more interfaces 270, wherein the interface 270 is connected to the fourth data connection 250 in terms of data. A predefined algorithm, for example a computer program, may be stored in the data memory 265, on the basis of which the computing device 260 detects, evaluates and/or determines at least a control signal and controls at least one of the field devices in conjunction with the data supplied via the field device. The control module 80 may be integrated into a network via the fourth data connection 250.

The feed connection 251 may be identical to the feed connection 251 of the third coupling module 180, as explained in FIG. 3.

The arrangement of terminal modules 185 is exemplarily dispensed with in FIG. 5, so that the first coupling module 65 in FIG. 5 is arranged directly adjacent to control module 80 on the right-hand side of control module 80. The first coupling module 65 is electrically connected to control module 80 both in terms of data and power supply.

The control module 80 may be mounted particularly quickly and easily by arranging the control module 80 on the signal-distribution board 15 and by detachably fastening to the top-hat rail 20 by the third connector 255. Furthermore, the control system 10 is thus arranged in a particularly small installation space.

Furthermore, the control system 10 and the control program stored on the data memory 265 may be completely tested prior to installation in the automation system, so that functional safety of the control system 10 is ensured during installation. In this way, a downtime of the automation system for installation of the control system 10 may be kept to a minimum. Furthermore, the mechanical installation effort is low due to the arrangement of the control module 80 on the signal-distribution board 15.

Figure 7:
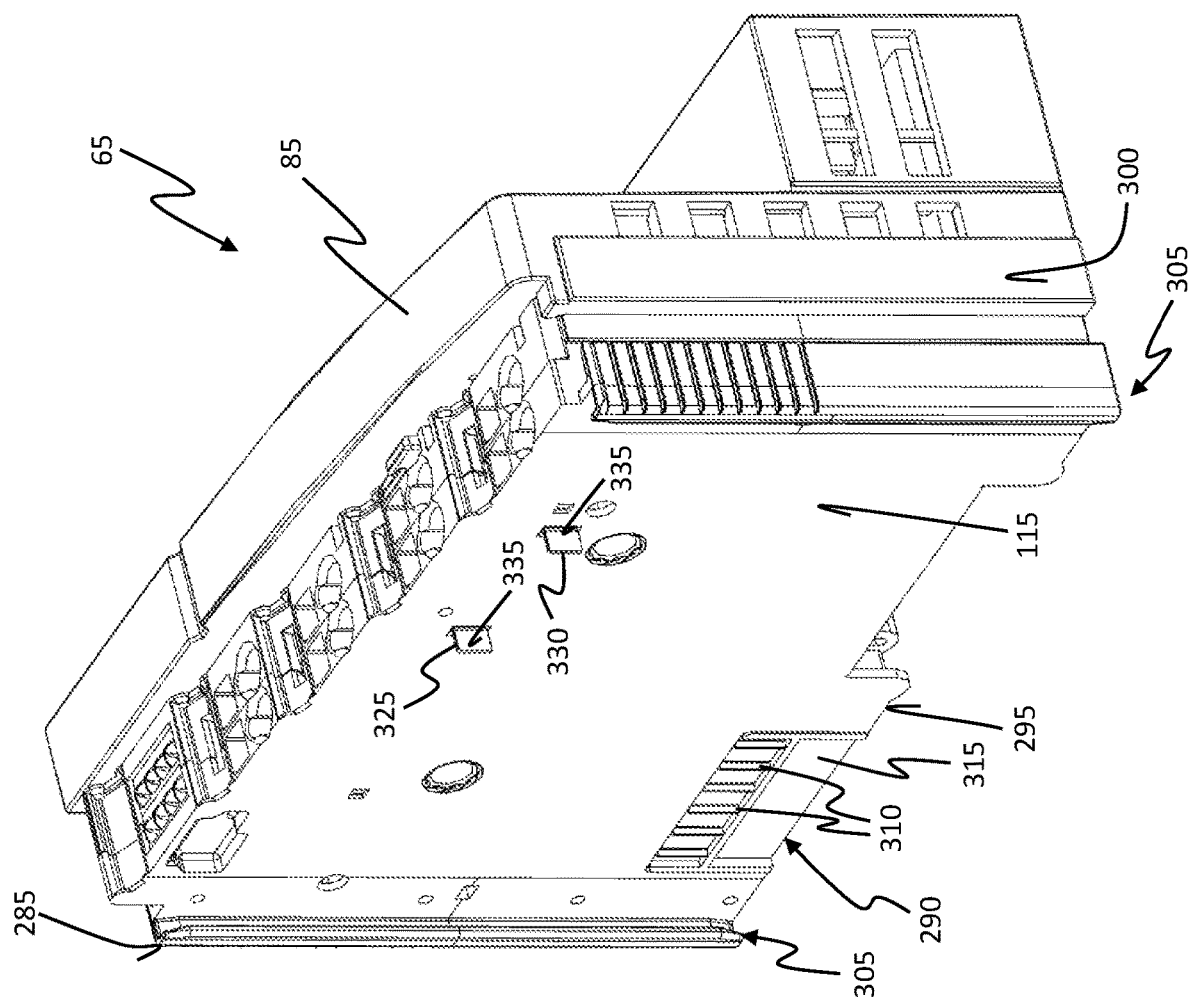
FIG. 7 depicts a perspective view of a first coupling module of the control system of FIG. 5.

FIG. 7 shows a perspective view of the first coupling module 65 of control system 10 shown in FIG. 5.

The first coupling module 65 comprises a first data-contact device 290 at the first housing-side face 115, which in its assembled state is arranged perpendicular to the front of the board. The first data-contact device 290 is arranged adjacent to a housing-rear face 295. The first data-contact device 290 is arranged set back in the transverse direction with respect to the first housing-side face 115 which is flat. The first data-contact device 290 is in this context arranged closer to the housing-top face 285 than to a housing-bottom face 300.

In addition, the first housing 85 may have a respective gripping section 305 laterally adjacent between the housing-top face 285 or the housing-bottom face 300 and the first housing-side face 115, wherein the gripping section 305 is L-shaped and extends at a free end with regard to the respective opposite housing-top face 285 or to the housing-bottom face 300. In the assembled state, the gripping section 305 grips a spring of the next module, e.g. of the control module or of the terminal module, arranged on the left side of the first coupling module 65, and connects the next module to the first coupling module 65 in a form fit. As a result, the modules may be placed on the top-hat rail 20 in an assembly and may be fastened to the top-hat rail 20 by the first and third connector. This also prevents unintentional loosening of the individual modules in the transverse direction.

The first data-contact device 290 comprises at least one first data contact 310, the first data contact 310 having a board-shaped embodiment and arranged at a distance from the housing-rear face 295. The first data contact 310 is immovably and substantially rigidly connected to the first housing 85. An indentation 315 may be arranged at the first housing-side face 115 to form the first data-contact device 290, wherein the first data contact 310 is respectively arranged at a bottom of the indentation 315, which then protrudes over the bottom of the indentation 315. Preferably, a plurality of first data contacts 310 is arranged at a distance from one another in the height direction, e.g. the z-direction. The first data-contact device 290 is, in terms of data, connected to the third contact device 90.

Furthermore, the first coupling module 65 comprises at least one first power-supply contact 325 on the first housing-side face 115 and a second power-supply contact 330 arranged in the height direction to the first power-supply contact 325. The first power-supply contact 325 and the second power-supply contact 330 may be board-shaped and identical to each other and protrude over the first housing-side face 115. The first power-supply contact 325 and the second power-supply contact 330 are aligned in parallel to each other. Thereby, the alignment is selected in such a way that a long side 335 of the first and second power-supply contact 325, 330 at which the power-supply contact 325, 330 has the largest surface are aligned in parallel to the x-axis and perpendicular to the first housing-side face 115.

Figure 8:
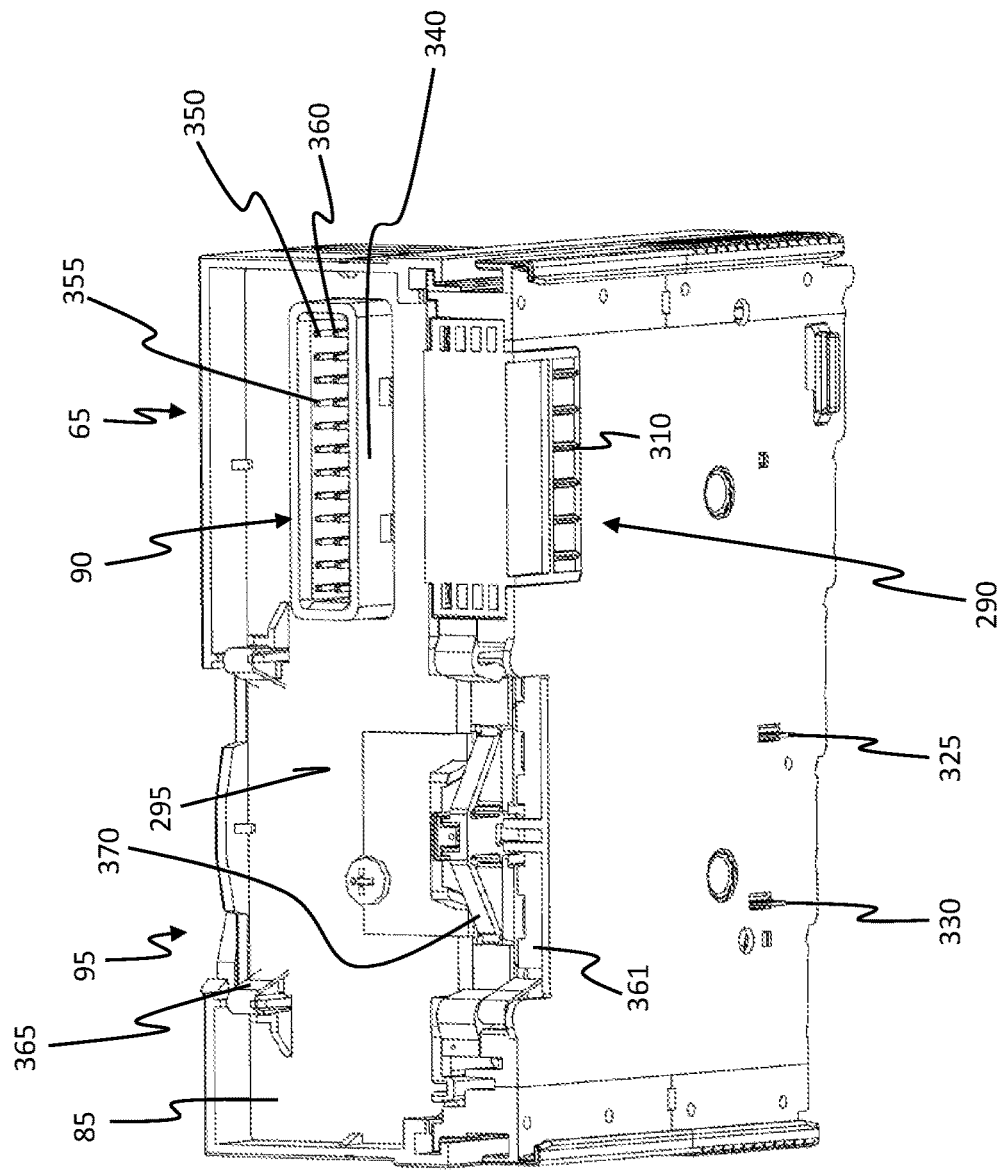
FIG. 8 shows a perspective view with a back-to-front view of the first coupling module of FIG. 7.

FIG. 8 shows a perspective view of the first coupling module 65 shown in FIG. 7, with a back-to-front view of the depicted first coupling module 65.

The third contact device 90 is located at the rear face of the housing 295. The third contact device 90 has a frame 340 at the first housing 85, which is rectangular in a top view, wherein a main direction of extension of the frame 340 is in the height direction.

The third contact device 90 is of exemplary multi-row design and comprises first to third contact elements 350, 360, 355, arranged in two rows and having an exemplarily pin-shaped embodiment which in the mounted state engage with the through-contact of the fourth contact device 231 and thereby establish an electrical connection between the first coupling module 65 and the signal-distribution board 15. In height direction, the third contact device 90 is arranged approximately at the height of the first data-contact device 290. The third contact device 90 comprises at least a first contact element 350, a second contact element 360 arranged in the transverse direction next to the first contact element 350 and at least a third contact element 355. Preferably, as shown in FIG. 8, the third contact device 90 has two rows of twelve first to third contact elements 350, 360, 355. The allocation is in this context exemplary and may of course be adapted to the application purpose.

In the embodiment, a first contact element 350 of the third contact device 90 is electrically connected to the first power-supply contact 325. The second power-supply contact 330 is electrically connected to the second contact element 360 of the third contact device 90. The first data contact 310 is electrically connected to the third contact element 355. As shown in the embodiment, six first data contacts 310 arranged at a distance with regard to one another in the height direction are provided, wherein a third contact element 355 is respectively provided at the third contact device 90 for each first data contact 310. This embodiment has the advantage that electrical energy for operating the signal-processing modules 75 may be fed into the signal-distribution board 15 via the first coupling module 65 and data may be exchanged between the first coupling module 65 and the signal-processing modules 75 via the signal-distribution board 15.

At the first housing-rear face 295, with an offset to the third contact device 90, a first recess 361 is arranged in which the top-hat rail 20 is arranged in a mounted state. The first recess 361 is groove-shaped and corresponds to an extension of the top-hat rail 20 in the x and z direction.

Furthermore, the first connector 95 is arranged at the first housing-rear face 295, wherein the first connector 95 comprises first retaining springs 365 which rest against both sides of the top-hat rail in order to fasten the first housing 85 to the top-hat rail. The first connector 95 further comprises a first engagement element 370 which engages in the center of the top-hat rail and is V-shaped. As a result, the first housing 85 is attached to the top-hat rail 20 without clearance.

Figure 9:
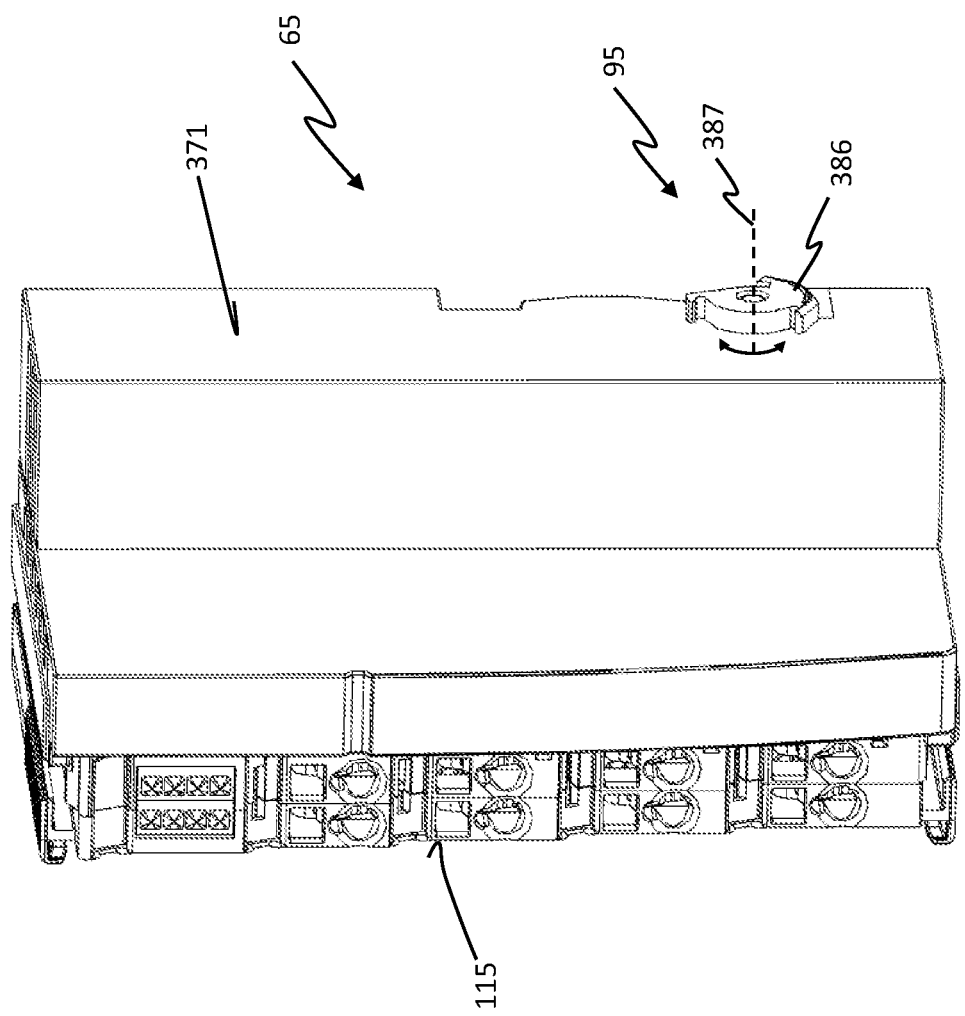
FIG. 9 shows another perspective view of the first coupling module of FIGS. 7 and 8.

FIG. 9 shows a perspective view of the first coupling module 65 shown in FIGS. 7 and 8.

On a second housing-side face 371 arranged opposite the first housing-side face 115, which runs parallel to the first housing-side face 115, the first coupling module 95 has a first rotary knob 386 which is mounted at a first axis of rotation 387 so that it may be rotated. The first rotary knob 386 may be rotated between a first unlocking position and a first locking position, wherein in the mounted state of the first coupling module 65 at the top-hat rail in the first unlocking position of the rotary knob 386 the first coupling module 65 may be removed from the top-hat rail and/or may be plugged on. In the first locking position, the first rotary knob 386 grips behind the top-hat rail in areas and prevents the first coupling module 65 from being drawn off the top-hat rail. It also prevents the first coupling module 65 from accidentally falling off the top-hat rail. This also ensures reliable contacting of the fourth contact device by the third contact device.

Figure 10:
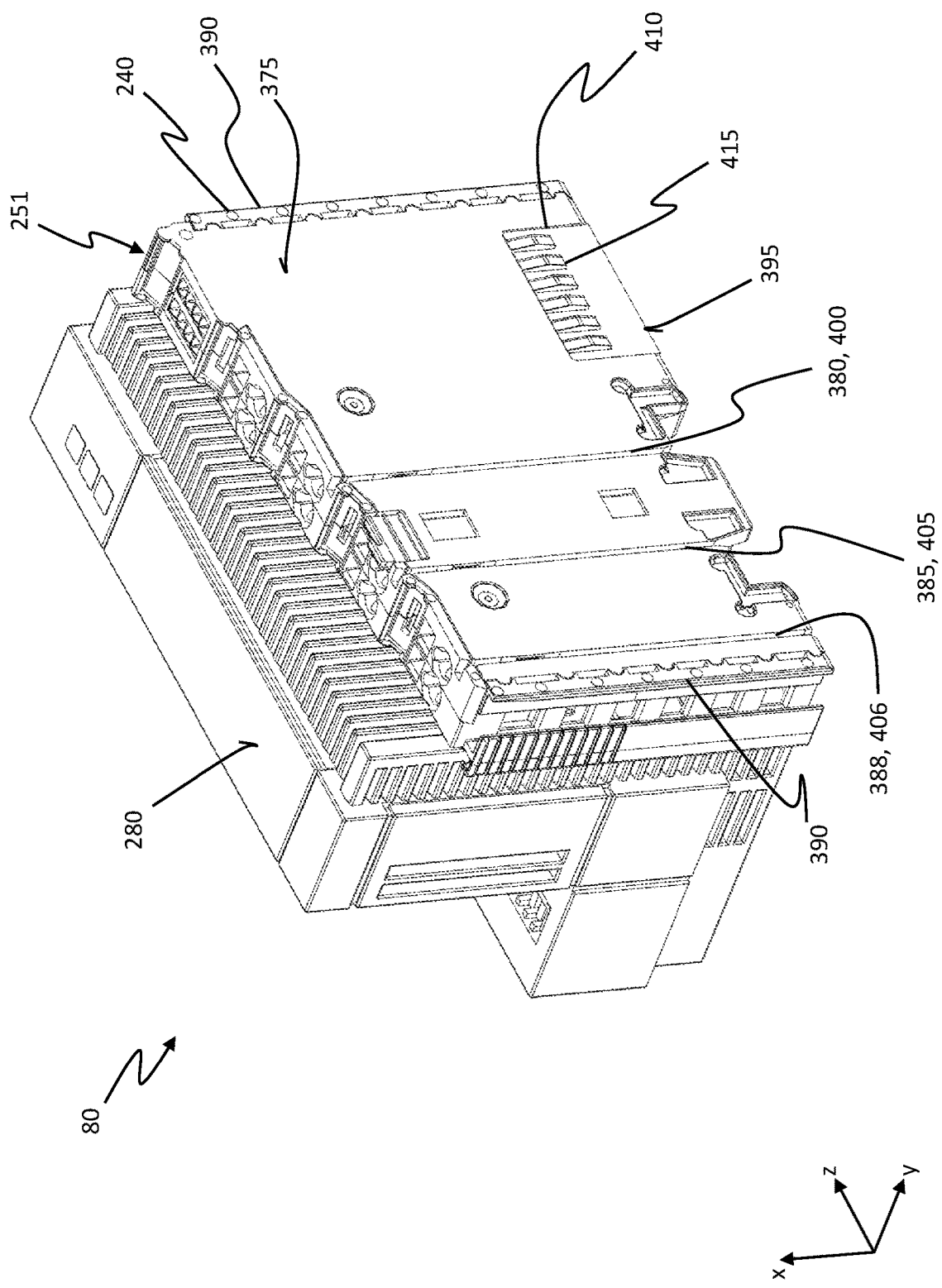
FIG. 10 is a perspective view of a control module of the control system shown in FIG. 5.

FIG. 10 shows a perspective view of the control module 80 shown in FIG. 5.

A first side face 375 of the control housing 240 is a plane and, when the control module 80 is mounted on the top-hat rail 20, is aligned perpendicular to the front side 25 of the signal-distribution board 15. The first control-housing-side face 375 is thereby in lateral contact with the first housing-side face 115 of the first coupling module or with the terminal module 185. The first side face 375 of the control housing is at the front face 280 of the control housing exemplarily adjoined by the feed connection 251.

The control housing 240 has at least a first groove 380 at the first control-housing-side face 375 and a second groove 385 arranged at an offset in the height direction with regard to the first groove 380. In addition, a third groove 388 may be arranged in the first control-housing-side face 375 which runs in parallel to the first and/or second groove 380, 385. The first to third grooves 380, 385, 388 extend from the control-housing-front face 280 to the control-housing-rear face 395. The control module 80 has a first slot contact 400 arranged in the first groove 380, a second slot contact 405 arranged in the second groove 385 and a third slot contact 406 arranged in the third groove 388.

The distance between the first and second grooves 380, 385 corresponds to a distance between the first power-supply contact 325 and the second power-supply contact 330.

If the first power-supply contact 325 engages in the first slot contact 400, it contacts the first slot contact 400. In the same manner, in a mounted state of the first coupling module or of the terminal module 185 at the top-hat rail 20, the second power-supply contact 330 contacts the second slot contact 405. The first and second slot contacts 400, 405 are electrically connected to the output side of the internal power supply unit so that the electrical power supply of the control module 80 and the terminal module is thus ensured. The first and second feed contacts 252, 253, as well, may be directly electrically connected to the first and second slot contact 400, 405. Furthermore, the first coupling module is electrically supplied with power by the first and second power-supply contacts 325, 330 engaging with the first and second slot contacts 400, 405.

The control module 80 has a second data-contact device 410 on the first control-housing-side face 375, the second data-contact device 410 being embodied to correspond to the first data-contact device of the first coupling module. The second data-contact device 410 respectively comprises a second data contact 415 corresponding to the arrangement and the number of first data contacts, the second data contact 415 respectively adjoining the first data contact in the transverse direction opposite in the mounted state and the first data-contact device thereby being contacted by the second data-contact device 410. The second data contact 415 can, for example, comprise a contact spring which may e.g. be swivelled in the transverse direction. This ensures a reliable contact of the second data contact 415 at the first data contact.

For fastening in the transverse direction, the gripping section 305 grips around the spring 390 which extends outwards and is arranged or, respectively, embodied on the top and bottom faces of the control housing 240.

Figure 11:
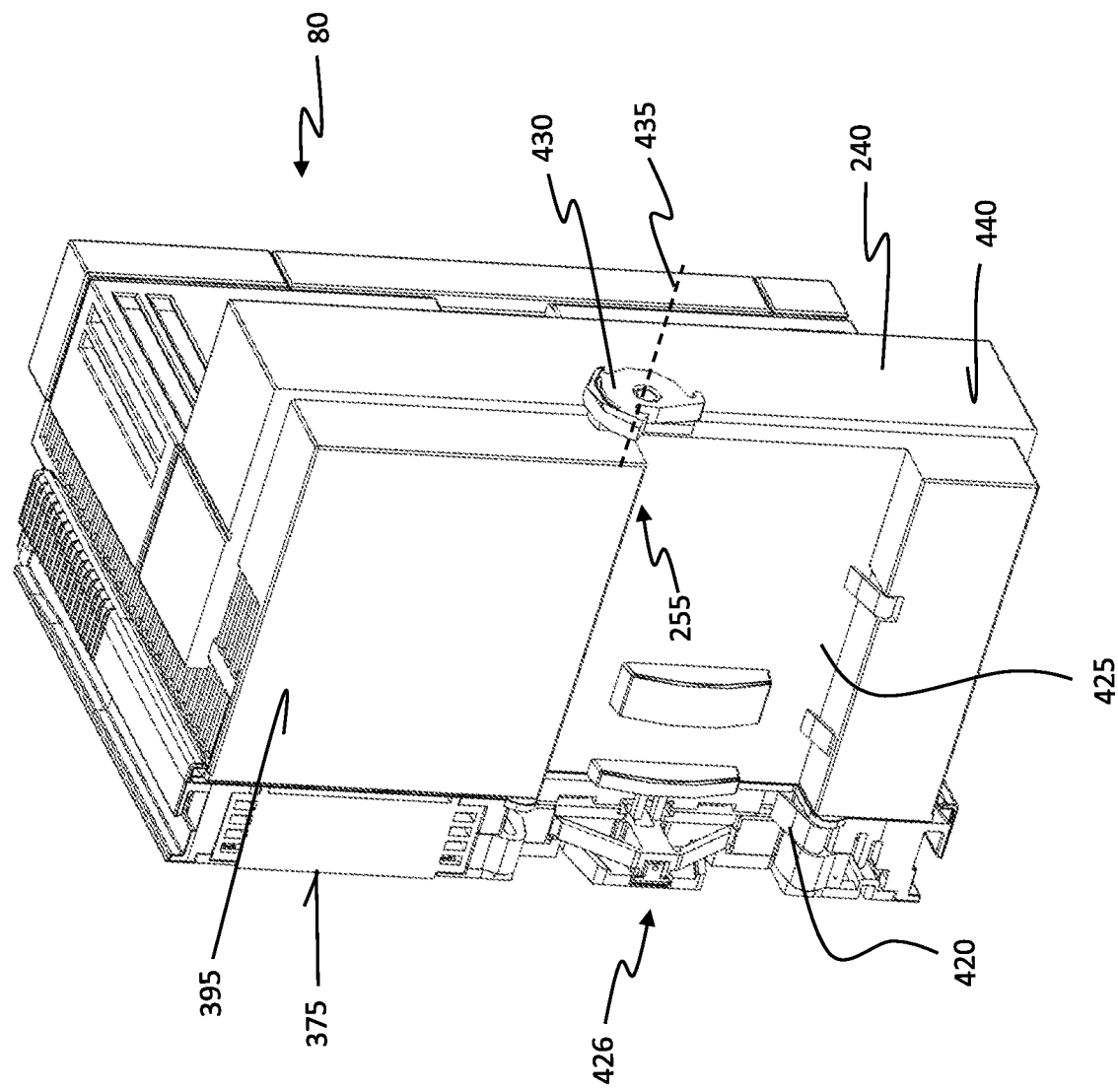
FIG. 11 is a perspective view of the control module of FIG. 10 from the rear to the front.

FIG. 11 shows a perspective rear-to-front view of the control module 80 shown in FIG. 10.

The third connector 255 has at least a second retaining spring 420 having the shape of a bar spring at the control-housing-rear face 395 arranged laterally adjacent to a groove-shaped second recess 425 of the control housing 240. When the control module 80 is mounted at the top-hat rail 20, the second retaining spring 420 engages behind the top-hat rail 20 and thus fastens the control housing 240 in a form fit. Furthermore, a V-shaped second engagement element 426 may be arranged in the second recess 425 which in the mounted state engages in the top-hat rail 20.

In addition, the third connector 255 may have a second rotary knob 430, which is arranged rotatably about a second axis of rotation 435 on a second control-housing-side face 440 opposite to the first control-housing-side face 375.

Figure 12:
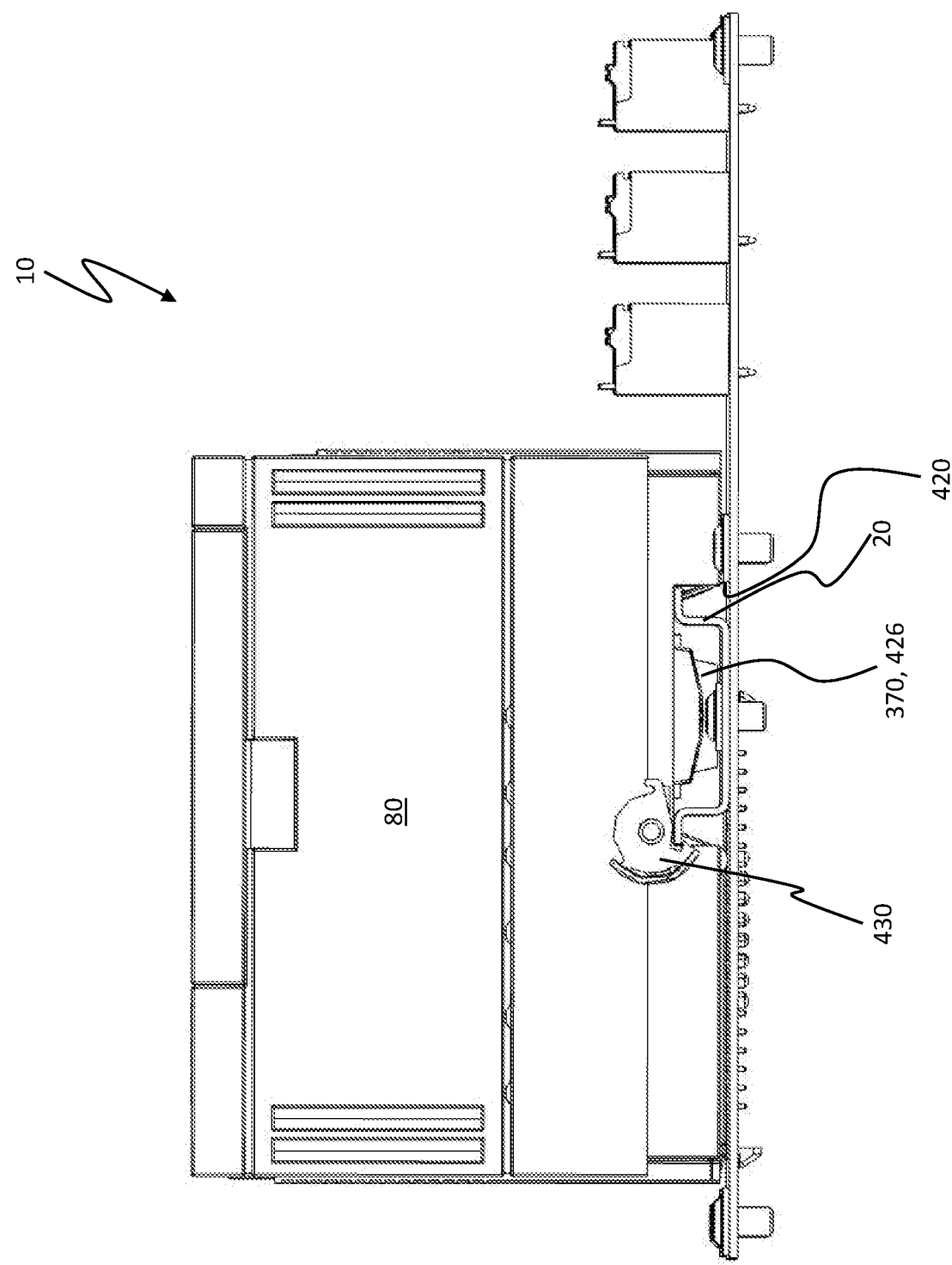
FIG. 12 shows a lateral view of the control system of FIG. 5.

FIG. 12 shows a lateral view of the control system 10 shown in FIG. 5.

The function of the second rotary knob 430 corresponds to that of the first rotary knob 386, so that the second rotary knob 430 has a second unlocking and a second locking position, wherein in the second unlocking position the control module 80 may be attached to the top-hat rail 20 and in the second locking position the second rotary knob 430 engages behind the top-hat rail 20 in areas so that a non-destructive, detachable connection of the control module 80 to the top-hat rail 20 may be provided by the third connector.

The transversely opposite arrangement of the first and second rotary knobs 386, 430 and the coupling of the first coupling module, the terminal module 185 and the control module 80 in the assembly allows for a stable fastening of the entire assembly to the top-hat rail 20 and to the signal-distribution board 15 to be achieved and ensured. Furthermore, a good alignment of the control module 80 and the first coupling module at the top-hat rail 20 is made possible by the first and second engagement element.

Figure 13:
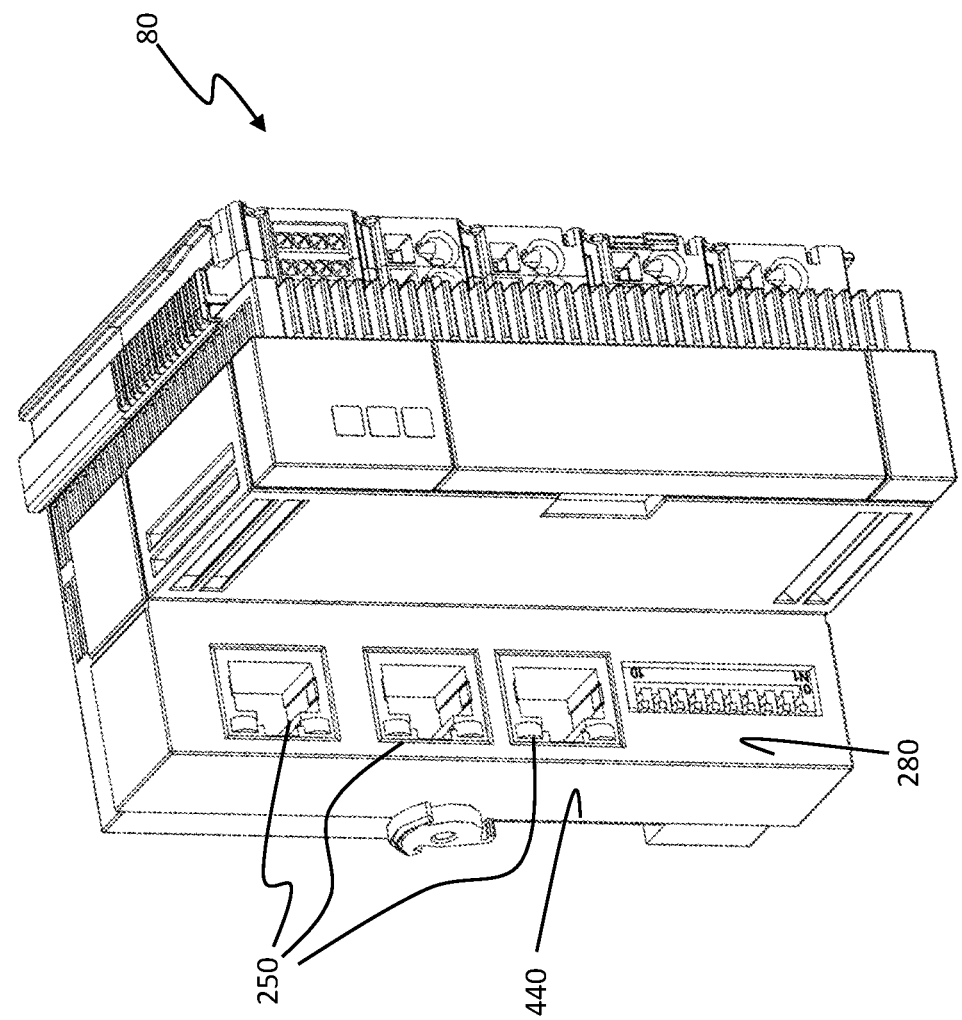
FIG. 13 is another perspective front-to-rear view of the control module shown in FIGS. 10 and 11.

FIG. 13 shows a further perspective front-to-rear of the control module 80 shown in FIGS. 10 to 12.

Adjacent to the second control-housing-side face 440, the fourth data connection 250 is arranged at the front face of the control housing 280 which is exemplarily embodied as an RJ45 socket. Preferably, a plurality of fourth data connections 250 arranged next to each other in the height direction are provided which are e.g. embodied to connect control module 80 to a network, for example a network that is operated according to the EtherCAT standard.

Figure 14:
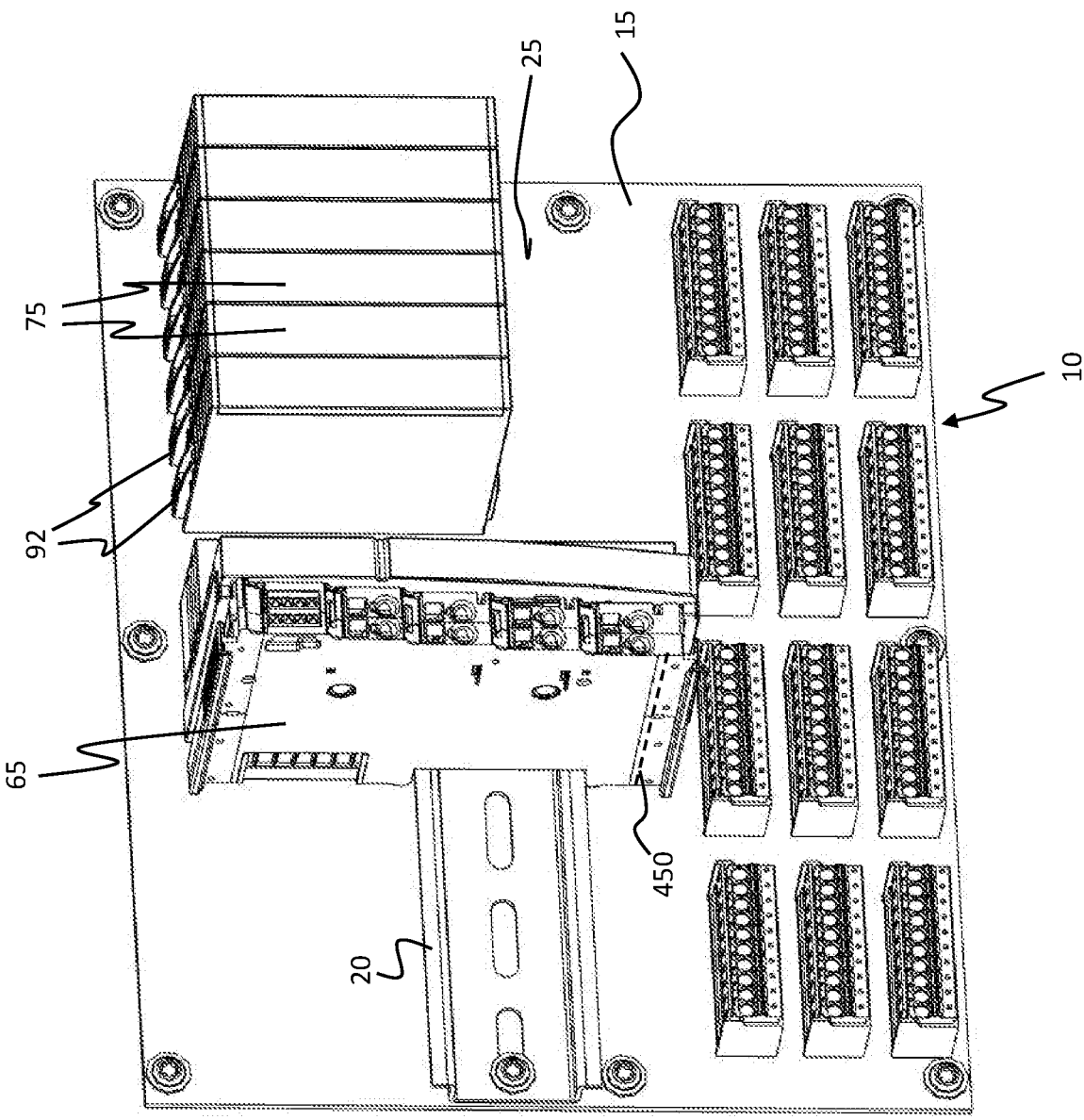
FIG. 14 depicts a perspective view of the control system shown in FIG. 5 in a partially mounted state after a third method step.

FIG. 14 shows the control system 10 shown in FIG. 5 in a partially assembled state after a third method step.

In a first method step for mounting the control system 10 shown in FIG. 5, the signal-distribution board 15 comprising the first contact devices 55 already attached to it and the top-hat rail 20 attached to the signal-distribution board 15 are provided. Furthermore, the control module 80, the first coupling module 65 and, if the case may be, signal-processing modules 75 are provided as individual modules.

In a second method step following the first method step, the signal-processing modules 75 are mounted in the second board area so that the signal-processing modules 75 are connected to the signal-distribution board 15 by the fastener 92 in a form fit. In the process, the signal-processing modules 75 contact the second contact device 60, so that the signal-processing modules 75 are also electrically connected to the first contact devices 55 via the signal-distribution board 15.

In a third method step following the second method step, the first coupling module 65 is mounted in the first board area. In this context, the first coupling module 65 is plugged onto the top-hat rail 20 in a first mounting movement carried out parallel to a mounting axis 450 extending in parallel to the x-axis and being aligned perpendicularly to the board-front side 25. The first rotary knob 386 is in the first unlocking position. Furthermore, the third contact device 90 is inserted into the fourth contact device 231 when the first coupling module 65 is plugged onto the top-hat rail 20. The fourth contact device 231 determines the position of the first coupling module 65 on the top-hat rail 20 in transverse direction.

After plugging on the first coupling module 65, the first rotary knob 386 is turned into the first locking position, so that the first coupling module 65 is secured to the top-hat rail 20.

Figure 15:
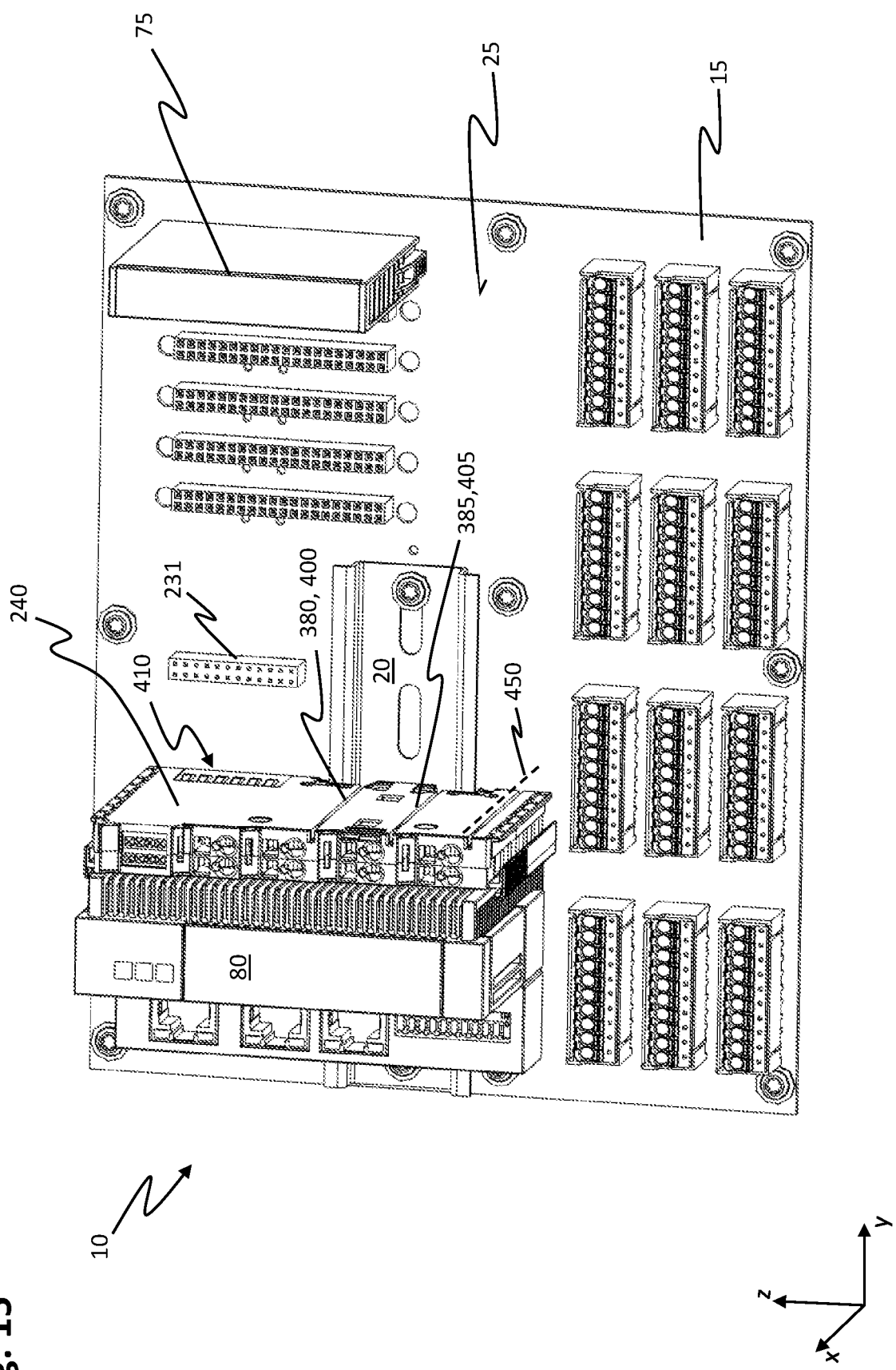
FIG. 15 shows a perspective view of the control system shown in FIG. 5 in a partially mounted state after the fourth method step.

FIG. 15 shows a perspective view of the control system 10 of FIG. 5 in a partially mounted state after a fourth method step. For reasons of clarity, some of the signal-processing modules 75 and the first coupling module 65 are shown in other drawings.

In a fourth method step following the third method step, the control module 80 is plugged onto the top-hat rail 20 parallel to the mounting axis 450 in a second mounting movement. In the process, the first and second power-supply contacts 325, 330 of the first coupling module 65 engage in the first and second slots 380, 385 of the control module 80, so that in the mounting movement the first and second power-supply contacts 325, 330 of the first coupling module 65 are guided through the first and second slots 380, 385 of the control module 80 and at the same time the first and second power-supply contacts 325, 330 of the first coupling module 65 contact the first and second slot contacts 400, 405 of the control module 80. Furthermore, the first data-contact device 290 of the first coupling module 65 contacts the second data-contact device 410 of the control module 80. When plugged in, the second rotary knob 430 is in the second unlocking position. After plugging the control module 80 onto the top-hat rail 20, the second rotary knob 380 is turned into the second locking position around the second rotary axis 435 so that the control module 80 is secured at the top-hat rail 20. Furthermore, the control housing 240 is attached to the rear of the board-front side 25 so that torque transmission from the control module 80 to the signal transmission board 15 is reduced. This means that the signal-distribution board 15 may have a particularly thin embodiment in the x-direction.

By contacting the first and second power-supply contacts 325, 330 of the first coupling module 65 via the first and second slot contacts 400, 405 of the control module 80, a reliable power supply of the first coupling module 65 is provided. Furthermore, the additional power-supply connection 230, as shown in FIG. 1 may e.g. be dispensed with.

The embodiment described in FIGS. 5 to 15 has the advantage that a particularly compact control system 10 may be provided with a control module 80 embodied as a top-hat-rail PC. As a result, the number of modules arranged on the signal-distribution board 15 may be kept particularly low so that on the one hand the installation space required for the control system 10 is particularly compact and on the other hand the number of mounting steps is reduced compared to known control systems.

Furthermore, by the third and fourth contact device 90, 231, data may be exchanged directly via the signal-distribution board 15 which is embodied as an application-specific printed-circuit board by the signal-processing modules 75. The direct coupling of the control module 80 means that e.g. extension (coupling) modules are not required.

Figure 16:
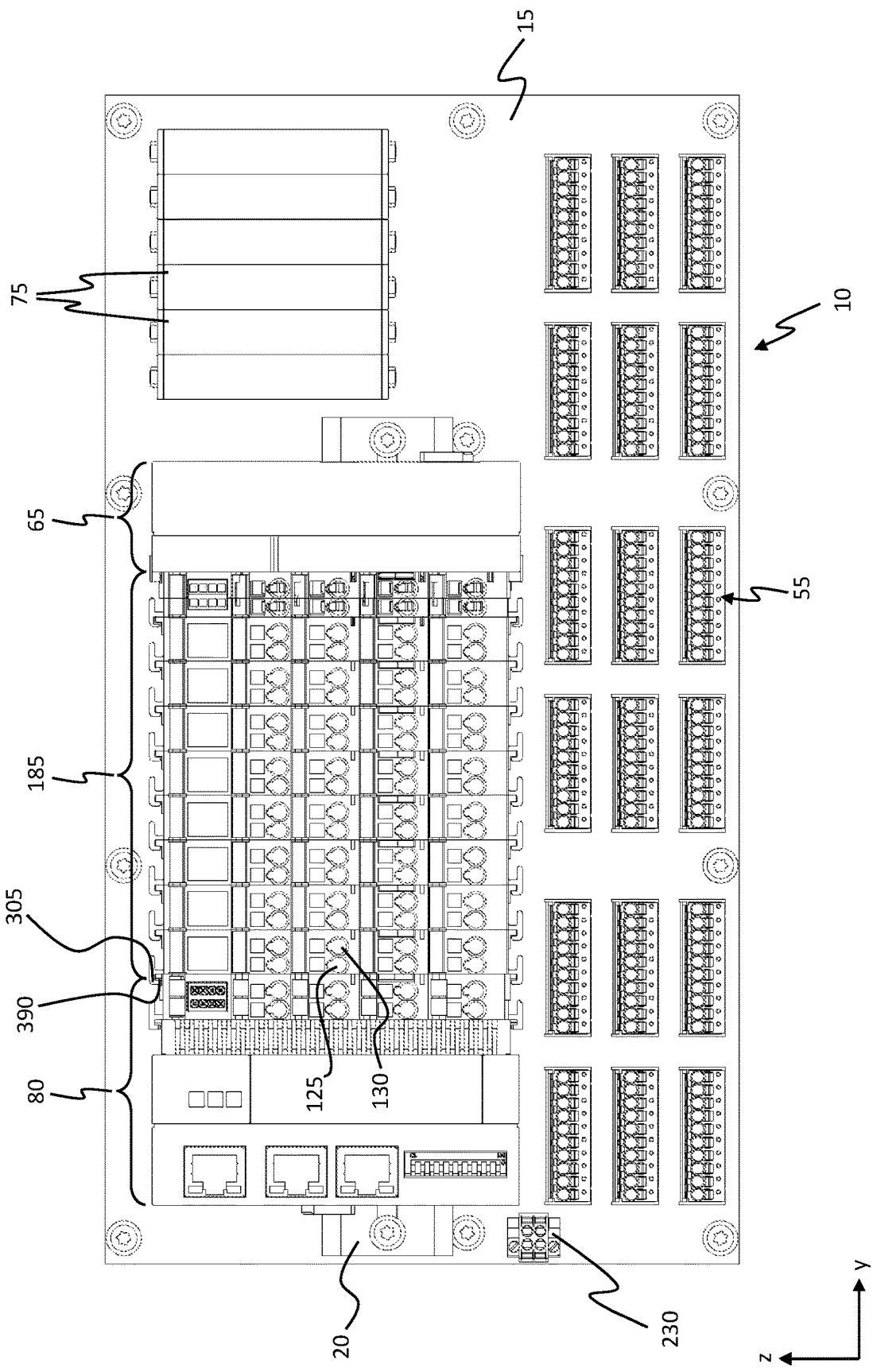
FIG. 16 is a front view of a control system according to a fourth embodiment.

FIG. 16 shows a front view of a control system 10 according to a fourth embodiment.

The control system 10 is a combination of the control system shown in FIG. 5 with the terminal modules 185 described in conjunction with FIGS. 3 and 4, with the terminal modules 185 being arranged transversely between the first coupling module 65 and the control module 80. The number of terminal modules 185 is exemplary. Furthermore, the respective field contacts 125, 130 may be adapted in such a way that terminal modules 185 are provided which cannot be provided e.g. by the signal-processing modules 75. For mechanical fastening, the spring 390 engages in the gripping section 305. The gripping section 305 grips around the nearest housing of the control module 80.

Each terminal module 185 has the first data-contact device 310 on the left side and the second data-contact device 410 on the right side, so that the data connection is looped through the terminal module 185 in order to provide a data connection between control module 80 and the first coupling module 65 in this way. In the same way, the power-supply contacts are arranged on the left side of the terminal module 185 and the slot contacts are arranged on the right side of the terminal module 185 so that the power supply from the control module 80 to the first coupling module 65 is looped through the terminal module 185. Furthermore, the terminal module 185 is supplied with electrical energy from the control module 80.

This means that the control system 10 may be flexibly adapted to the automation system and, if necessary, extended accordingly by the terminal module 185.

In addition, the supply connection 230 explained in FIGS. 1 to 3 may be arranged on the signal-distribution board 15 for supplying the first contact devices 55 and the signal-processing modules 75.

Moreover, the number of first contact devices 55 is increased compared to the embodiment of control system 10 shown in FIG. 5, so that a larger number of field devices may be connected to the control system 10.

The signal-distribution board 15 is wider in the transverse direction than shown in FIG. 3, so that there is sufficient installation space for an extended top-hat rail 20 on the signal-distribution board 15. This allows for a particularly large number of terminal modules 185 to be arranged between the control module 80 and the first coupling module 65.

Figure 17:
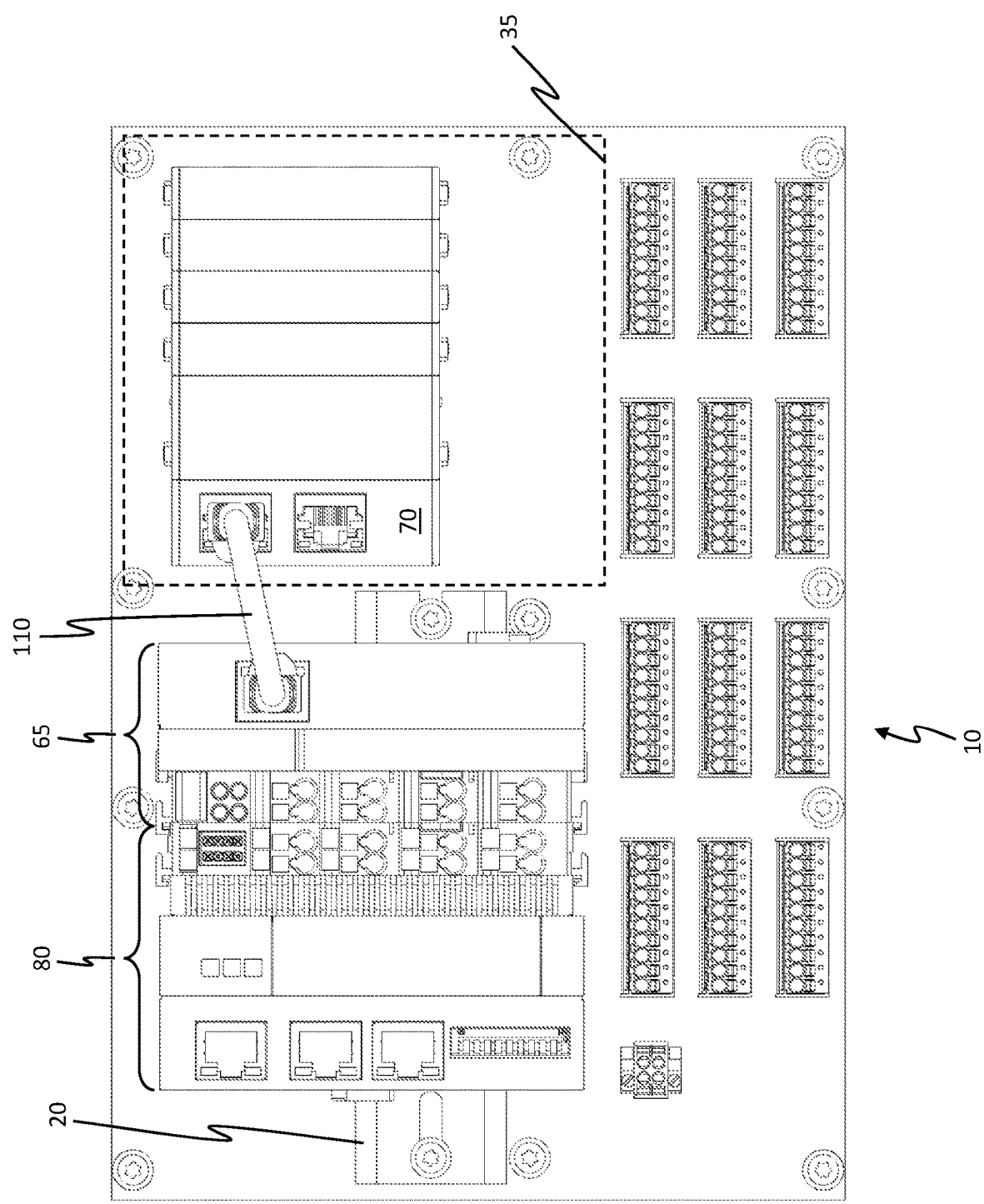
FIG. 17 shows a front view of a control system according to a fifth embodiment.

FIG. 17 shows a front view of a control system 10 according to a fifth embodiment.

The control system 10 is a combination of the control system described in conjunction with FIG. 5 and the control system described in conjunction with the control systems in FIGS. 1 to 3. The control module 80 is in this context mounted on the top-hat rail 20 instead of the third coupling module, wherein the first coupling module 65, explained in FIGS. 1 to 3, is arranged on the right side of the top-hat rail 20. The first coupling module 65 corresponds to the first coupling module 65 explained in FIGS. 1 to 3 and is connected to the second coupling module 70 by the first data cable 110, the second coupling module 70 being embodied as described in FIGS. 1 to 3 and arranged in the second board area 35. The first coupling module 65 is connected to the control module 80 in terms of data technology and is supplied via the power-supply unit of the control module 80.

Compared to the embodiment shown in FIGS. 1 to 3, this embodiment has the advantage that there is no need to arrange the control module 80 separately and connect the control module 80 via the second data cable 220. This allows for the control system 10 to be embodied in a particularly compact manner.

By arranging the control module 80 on the top-hat rail 20, the control system 10 may be tested in advance and may later be installed as a complete unit in an assembly of the automation system in the best possible way.

Summing up, according to an embodiment a control system 10 is provided in which only the first coupling module 65 mounted onto the top-hat rail 20 comprises, at the housing-rear face 295, a third contact device 90 which in a mounted state engages with the through-contact of the fourth contact device 231 on the signal-distribution board 15 and thereby achieves an electrical connection between the first coupling module 65 and the signal-distribution board 15, and in which the first coupling module 65, at a first housing-side face 115 arranged perpendicularly to a board-front face 25 of the signal-distribution board in a mounted state, comprises a first data-contact device 290 and at least a first and a second power-supply contact 325, 330, whereas all further third coupling modules 180, terminal modules 185 and/or control modules 80 mounted on the top-hat rail 20 merely comprise first and/or second data-contact devise 290, 410 and at least first and second slot contacts 400, 405 on at least one of their side faces arranged perpendicularly to a board-front face 25 of the signal-distribution board 15 in a mounted state, whereas in the mounted state an electrical connection for transmitting data exists between all first and second data-contact devices 290, 410 and an electrical connection for transmitting power exists between all first power-supply contacts 325 and all first slit contacts 400, or, respectively, an electrical connection for transmitting power exists between all second power-supply contacts 330 and all second slit contacts 405, wherein the third coupling modules 180, terminal modules 185 and/or control modules 80 comprise further field connections 120, first and second field contacts 125, 130, first to firth feed contacts 252, 253, 254, 140, 155 and/or second to fourth data connections 195, 200, 205 on a front side facing away from the board-front side 25 of the signal-distribution board 15, whereas the signal-processing modules 75 arranged on the signal-distribution board 15 comprise contact devices exclusively on the side facing the board-front face 25 of the signal-distribution board 15 which in the mounted state form an electrical connection for transmitting data as well as for transmitting power with the second contact devices 60 arranged on the signal-distribution board 15.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

TABLE 1

List of Reference Numerals

| | | |
|---|---|---|
| 10 control system | 135 third field contact | 300 housing-bottom face |
| 15 signal-distribution board | 140 fourth field contact | 305 gripping section |
| 16 connecting screw | 145 third row | 310 first data contact |
| 17 printed-circuit board | 155 fifth field contact | 315 indentation |
| 18 printed-circuit-board layer | 160 second housing | 320 dummy-field connection |
| 19 conductor-path layer | 165 first data connection | 325 first power-supply contact |
| 20 top-hat rail | 170 second housing-front face | 330 second power-supply contact |
| 25 board-front side | 175 second plug | 335 long side |
| 30 first board area | 180 third coupling module | 340 frame |
| 35 second board area | 185 terminal module | 350 first contact element |
| 40 third board area | 190 third housing | 355 second contact element |
| 45 screw connection | 195 second data connection | 360 third contact element |
| 55 first contact device | 200 third data connection | 365 first retaining spring |
| 56 first row | 205 second connector | 370 first engagement element |
| 57 lower edge | 210 second housing-front face | 371 second housing-side face |
| 57 lower edge | 215 third plug | 375 first control-housing-side face |
| 60 second contact device | 220 second data cable | 380 first groove |
| 65 first coupling module | 230 power-supply connection | 385 second groove |
| 70 second coupling module | 231 fourth contact device | 386 first rotary knob |
| 75 signal-processing module | 235 upper board edge | 387 first axis of rotation |
| 80 control module | 240 control housing | 390 spring |
| 85 first housing | 245 control device | 360 third contact element |
| 86 encoding device | 250 fourth data connection | 395 control-housing-rear face |
| 90 third contact device | 251 feed connection | 400 first slot contact |
| 91 through-hole | 252 first feed contact | 405 second slot contact |
| 92 fastener | 253 second feed contact | 410 second data-contact device |
| 93 second row | 254 third feed contact | 415 second data contact |
| 95 first connector | 255 third connector | 420 second retaining spring |
| 100 first housing-front face | 260 computing device | 425 second recess |
| 105 first plug | 265 data memory | 426 second engagement element |
| 110 first data cable | 270 interface | 430 second rotary knob |
| 115 first housing-side face | 280 control housing-front face | 435 second axis of rotation |
| 120 field connection | 285 housing-top face | 395 control-housing-rear face |
| 125 first field contact | 290 first data-contact device | 440 second control-housing-side face |
| 130 second field contact | 295 housing-rear face | 450 mounting axis |

The invention claimed is:

1. A control system for controlling an automation system, comprising:

a signal-distribution board, a top-hat rail, at least a first contact device and at least a second contact device, wherein the at least the first contact device and the at least the second contact device are arranged at an offset with regard to each other on the signal-distribution board and the signal-distribution board electrically connects the at least the first contact device to the at least the second contact device at least for transmitting data, wherein the top-hat rail is mechanically fastened to the signal-distribution board and a first coupling module is mechanically fastened to the top-hat rail, wherein the at least the second contact device is configured to electrically contact a signal-processing module or a second coupling module, and wherein the at least the first contact device is electrically connected to a field device; and wherein:

the first coupling module has a first housing, a third contact device and a detachable first connector, a first recess in which the top-hat rail engages is arranged on a first housing-rear face of the first housing, the first connector is connected to the first housing and is configured to engage in the top-hat rail for non-destructively reversibly detachable fastening of the first housing at the top-hat rail, and the third contact device is arranged at the first housing and is configured for transmitting the data.

2. The control system according to claim 1, wherein:

the signal-distribution board comprises a printed-circuit board, the printed-circuit board has at least one printed-circuit-board layer having an electrically insulating material, the printed-circuit board comprises at least one conductor-path layer of an electrically conductive material arranged on the at least one printed-circuit-board layer, and the at least one printed-circuit-board layer is configured to support mechanical forces from the top-hat rail and the at least one conductor-path layer is configured to electrically connect the at least the first contact device to the at least the second contact device.

3. The control system according to claim 2, wherein:

the printed-circuit board comprises a plurality of printed-circuit: board layers including the at least one printed-circuit-board layer, a respective one of the at least one conductor-path layer made from the electrically conductive material is arranged between each adjacent pair of the plurality of the printed-circuit-board layers, and a plurality of conductor-path layers including the at least one conductor path layer and the printed-circuit-board layers are alternatingly arranged in a stack.

4. The control system according to claim 1, wherein the third contact device is arranged on the first housing-rear face of the first housing at an offset in a direction perpendicular to a longitudinal extension of the first recess with regard to the first connector.

5. The control system according to claim 1, wherein:

the first coupling module comprises a first data-contact device at a first housing-side face of the first housing, and the first data-contact device is coupled to the third contact device for transmitting the data.

6. The control system according to claim 5, wherein:
the first coupling module comprises at least a first power-supply contact and at least a second power-supply contact at the first housing-side face,
the at least the first power-supply contact is directly or indirectly connected to a first pole of a DC-voltage source and the at least the second power-supply contact is directly or indirectly connected to a second pole of the DC-voltage source, and
the at least the first power-supply contact is electrically connected to a first contact element of the third contact device and the at least the second power-supply contact is electrically connected to a second contact element of the third contact device for transmitting supply power.

7. The control system according to claim 6, wherein:
the at least the first power-supply contact and/or the at least the second power-supply contact has a board-shaped embodiment and protrudes over the first housing-side face, and
the at least the first power-supply contact and/or the at least the second power-supply contact is aligned with a long side perpendicular to the first housing-rear face of the first housing.

8. The control system according to claim 6, wherein:
the third contact device comprises at least one third contact element,
the at least one third contact element is coupled to the first data-contact device for transmitting the data.

9. The control system according to claim 1, further comprising:
the second coupling module, wherein the second coupling module is mechanically connected to the signal-distribution board by a fastener, and
wherein the second coupling module is electrically connected to the third contact device of the first coupling module for transmitting the data.

10. The control system according to claim 9, further comprising:
a power-supply connection arranged at the signal-distribution board,
wherein the signal-distribution board electrically connects the power-supply connection to the at least the second contact device, and
wherein the second coupling module electrically contacts the at least the second contact device for transmitting the data and for supplying power to the second coupling module.

11. The control system according to claim 1, further comprising:
a fourth contact device arranged at the signal-distribution board, wherein the signal-distribution board electrically connects the fourth contact device to the at least the first contact device and/or to the at least the second contact device at least for transmitting the data,
wherein the fourth contact device is arranged adjacent to the top-hat rail on a board-front side of the signal-distribution board facing the top-hat rail, and
wherein the third contact device is arranged on the first housing-rear face of the first housing facing the signal-distribution board and the third contact device of the first coupling module electrically contacts the fourth contact device.

12. The control system according to claim 1, further comprising:

a control module, wherein the control module comprises at least a control device for carrying out a control process, a control housing accommodating the control device and a reversibly detachable further connector,
wherein the control module is mounted on the top-hat rail, and
wherein the further connector is connected to the control housing and configured to engage behind the top-hat rail for non-destructively detachable fastening of the control housing to the top-hat rail.

13. The control system according to claim 12, wherein:
the control housing comprises at least a first groove at a first control-housing-side face facing a first housing-side face of a first housing of the first coupling module and the control module has at least a first slot contact arranged in the at least the first groove,
the at least the first groove is adapted to guide a first power-supply contact of the first coupling module in a mounting movement of the first coupling module, and
the at least the first slot contact contacts the first power-supply contact for supplying power to the first coupling module.

14. The control system according to claim 13, wherein:
the control housing comprises, on the first control-housing-side face, at least a second groove arranged at an offset with regard to the at least the first groove,
the at least the first groove and the at least the second groove are arranged perpendicularly to the signal-distribution board and at a predefined distance from each other, and
the predefined distance corresponds to a distance between the first power-supply contact and a second power-supply contact of the first coupling module, at the first housing-side face.

15. The control system according to claim 13, wherein:
the control module has a second data-contact device at the first control-housing-side face,
the second data-contact device is formed corresponding to a first data-contact device of the first coupling module and is electrically connected to the first data-contact device for transmitting the data, and
the second data-contact device is electrically connected to the control device for processing the data which is transmitted by the first and second data-contact devices.

16. The control system according to claim 13, wherein:
the control module has at least one feed connection with at least one first feed contact on a control housing-front face of the control housing facing away from the signal-distribution board,
the at least one first feed contact is electrically connected to a power supply, and
the at least the first slot contact is electrically connected to the at least one first feed contact.

17. A control system for controlling an automation system, comprising:
a signal-distribution board, a top-hat rail, at least a first contact device and at least a second contact device,
wherein the at least the first contact device and the at least the second contact device are arranged at an offset with regard to each other on the signal-distribution board and the signal-distribution board electrically connects the at least the first contact device to the at least the second contact device at least for transmitting data,
wherein the top-hat rail is mechanically fastened to the signal-distribution board and a first coupling module is mechanically fastened to the top-hat rail, wherein the at least the second contact device is configured to electrically contact a signal-processing module or a second coupling module, and wherein the at least the first contact device is electrically connected to a field device; and wherein:
- the signal-distribution board comprises a first board area, a second board area and a third board area on a board-front side,
- a respective one of the first to third board areas is arranged adjacent to each of two others of the first to third board areas,
- the top-hat rail is arranged in the first board area,
- a plurality of second contact devices including the at least the second coupling device are arranged in the second board area, and
- a plurality of first contact devices including the at least the first coupling device are arranged in the third board area.

18. A method of mounting a control system for controlling an automation system comprising a signal-distribution board, a top-hat rail, at least a first contact device and at least a second contact device, wherein:

the signal-distribution board, a first coupling module and a control module are provided, wherein the at least the first contact device and the at least the second contact device are arranged at an offset with regard to each other on the signal-distribution board and the signal-distribution board electrically connects the at least the first contact device to the at least the second contact device at least for transmitting data, wherein the top-hat rail is mechanically fastened to the signal-distribution board and the first coupling module is mechanically fastened to the top-hat rail, wherein the at least the second contact device is configured to electrically contact a signal-processing module or a second coupling module, and wherein the at least the first contact device is electrically connected to a field device, the first coupling module comprises a first housing, a third contact device and a detachable first connector, the control module comprises at least a control device for carrying out a control process, a control housing accommodating the control device and a reversibly detachable further connector, the first coupling module is mounted on the top-hat rail in a first mounting movement perpendicular to the signal-distribution board, and the first connector connects the first coupling module to the top-hat rail in a form fit, and the control module is mounted on the top-hat rail in a second mounting movement perpendicular to the signal-distribution board and the further connector connects the control housing to the top-hat rail in a form fit.

19. The method according to claim 18, wherein:

a fourth contact device is arranged at the signal-distribution board, wherein the signal-distribution board electrically connects the fourth contact device to the at least the first contact device and/or to the at least the second contact device at least for transmitting the data, and the third contact device is inserted into the fourth contact device when the first coupling module is plugged onto the top-hat rail.

* * * * *

UNITED STATES PATENT AND TRADEMARK OFFICE
CERTIFICATE OF CORRECTION

PATENT NO. : 11,128,111 B2
APPLICATION NO. : 16/875393
DATED : September 21, 2021
INVENTOR(S) : Torsten Budde et al.

Page 1 of 1

It is certified that error appears in the above-identified patent and that said Letters Patent is hereby corrected as shown below:

In the Claims

At Column 24, Lines 49-50 (Claim 3, Lines 2-3) reading:
"a plurality of printed circuit: board layers"
Should be:
--a plurality of printed-circuit-board layers--

Signed and Sealed this
Eleventh Day of January, 2022

Drew Hirshfeld
*Performing the Functions and Duties of the*
*Under Secretary of Commerce for Intellectual Property and*
*Director of the United States Patent and Trademark Office*